US011422712B2

(12) United States Patent
Yoshimizu et al.

(10) Patent No.: US 11,422,712 B2
(45) Date of Patent: Aug. 23, 2022

(54) STORAGE DEVICE AND STORAGE SYSTEM INCLUDING A MEMORY TO STORE A CHECK CODE FOR AN INTEGRITY CHECK

(71) Applicant: Kioxia Corporation, Tokyo (JP)

(72) Inventors: Yasuhito Yoshimizu, Yokkaichi (JP); Takashi Fukushima, Yokkaichi (JP); Tatsuro Hitomi, Yokohama (JP); Arata Inoue, Chigasaki (JP); Masayuki Miura, Yokkaichi (JP); Shinichi Kanno, Ota (JP); Toshio Fujisawa, Yokohama (JP); Keisuke Nakatsuka, Kobe (JP); Tomoya Sanuki, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/121,024

(22) Filed: Dec. 14, 2020

(65) Prior Publication Data
US 2021/0149568 A1      May 20, 2021

Related U.S. Application Data

(63) Continuation of application No. PCT/JP2019/044933, filed on Nov. 15, 2019.

(51) Int. Cl.
*G06F 3/06* (2006.01)
*G06F 12/1009* (2016.01)
*G06F 12/02* (2006.01)

(52) U.S. Cl.
CPC ............ *G06F 3/0619* (2013.01); *G06F 3/064* (2013.01); *G06F 3/0688* (2013.01); *G06F 12/0246* (2013.01); *G06F 12/1009* (2013.01)

(58) Field of Classification Search
CPC ...... G06F 3/0619; G06F 3/064; G06F 3/0688; G06F 12/0246; G06F 12/1009;
(Continued)

(56) References Cited

U.S. PATENT DOCUMENTS 4,489,397 A    12/1984 Lee
6,228,684 B1    5/2001 Maruyama
(Continued)

FOREIGN PATENT DOCUMENTS

JP        64-28863 A     1/1989
JP     2005-228788 A     8/2005
(Continued)

*Primary Examiner* — Tasnima Matin
(74) *Attorney, Agent, or Firm* — Oblon, McClelland, Maier & Neustadt, L.L.P.

(57) ABSTRACT

According to one embodiment, a storage device includes a stage on which a semiconductor wafer can be mounted, wherein data is capable of being read from the semiconductor wafer or data is capable of being written to the semiconductor wafer. The storage device further includes a plurality of probe pins for reading or writing data, and a controller connected the probe pins. The semiconductor wafer includes electrodes connectable to the probe pins, a first memory area that can store user data, and a second memory area that can store identification information for identification of the semiconductor wafer and a check code for checking integrity of the identification information. The controller is capable of reading the identification information and the check code from the second memory area.

24 Claims, 24 Drawing Sheets

(58) Field of Classification Search
CPC ............. G06F 3/0644; G06F 3/0679; G06F 2212/1032; G06F 2212/7201; G06F 2212/7208; G11C 2029/5602; G11C 29/006; G11C 29/56016; G11C 29/76
See application file for complete search history.

(56) References Cited

U.S. PATENT DOCUMENTS

| | | |
|---|---|---|
| 6,740,981 B2 | 5/2004 | Hosomi |
| 10,332,860 B2 | 6/2019 | Fricker et al. |
| 2005/0259478 A1* | 11/2005 | An .................. G11C 29/48 365/233.14 |
| 2007/0002658 A1 | 1/2007 | Baker |
| 2008/0048689 A1* | 2/2008 | Lee .................. G01R 3/00 324/756.03 |
| 2012/0091211 A1 | 4/2012 | Kuroda |
| 2012/0198129 A1 | 8/2012 | Van Aken et al. |
| 2013/0089396 A1 | 4/2013 | Bufano et al. |
| 2017/0213795 A1* | 7/2017 | Hokazono ............ H01L 23/544 |
| 2018/0068320 A1* | 3/2018 | Yamada ............... G06Q 30/014 |
| 2019/0129841 A1 | 5/2019 | Kanno |
| 2019/0227116 A1 | 7/2019 | Boduch et al. |

FOREIGN PATENT DOCUMENTS

| | | |
|---|---|---|
| JP | 2007-96190 A | 4/2007 |
| JP | 3980807 B2 | 9/2007 |
| JP | 2010-512586 A | 4/2010 |
| JP | 2010-287113 A | 12/2010 |
| JP | 2019-82817 A | 5/2019 |
| WO | WO 2008/070811 A2 | 6/2008 |

\* cited by examiner

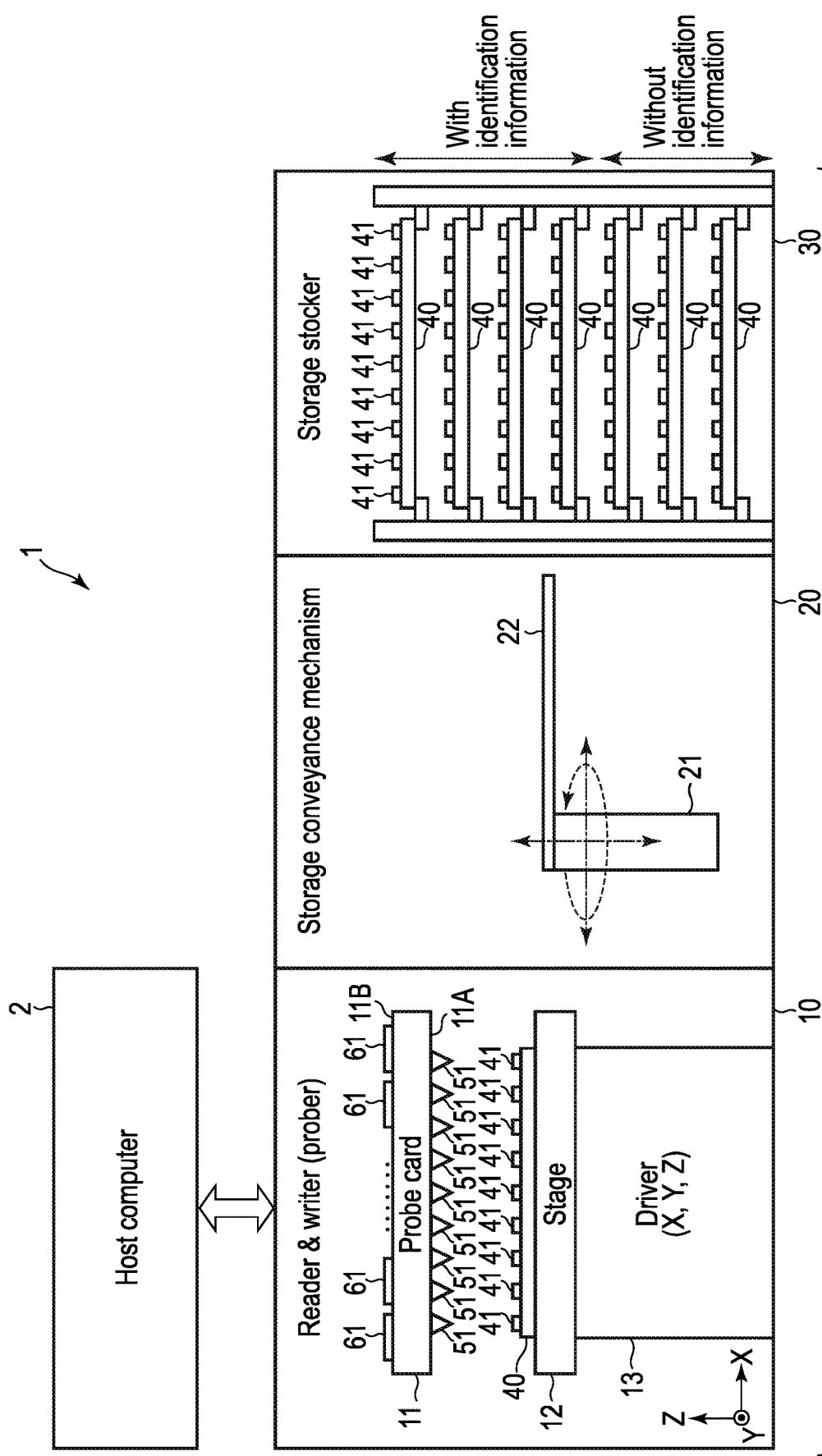
F I G. 1

F.I.G. 2

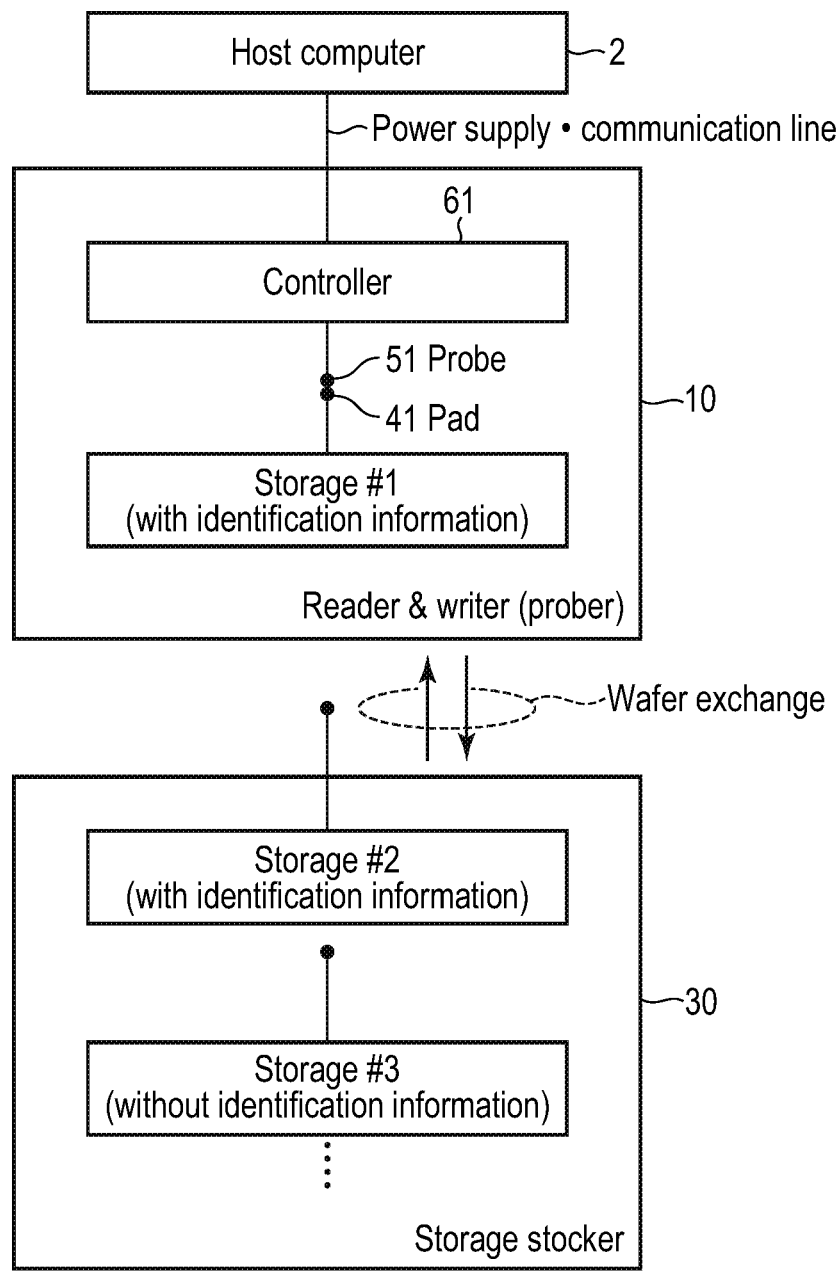
F I G. 6

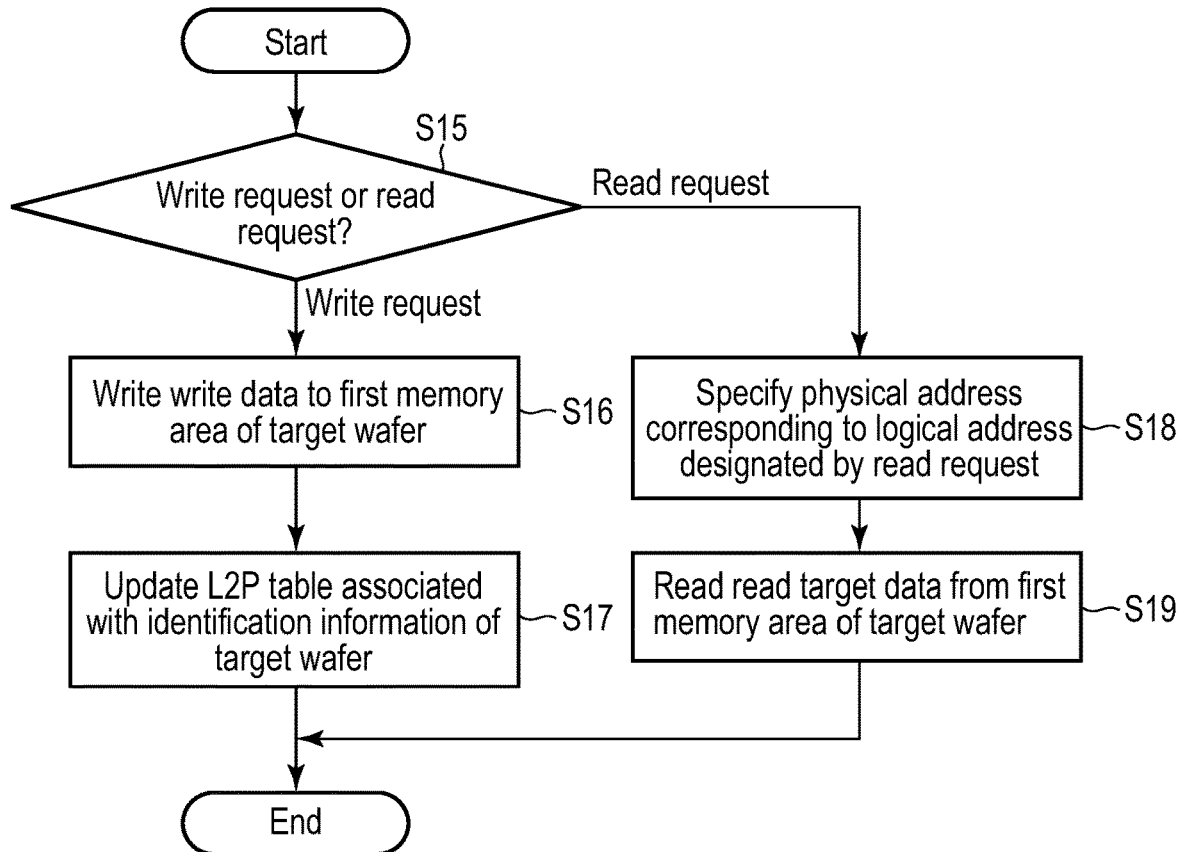
F I G. 9
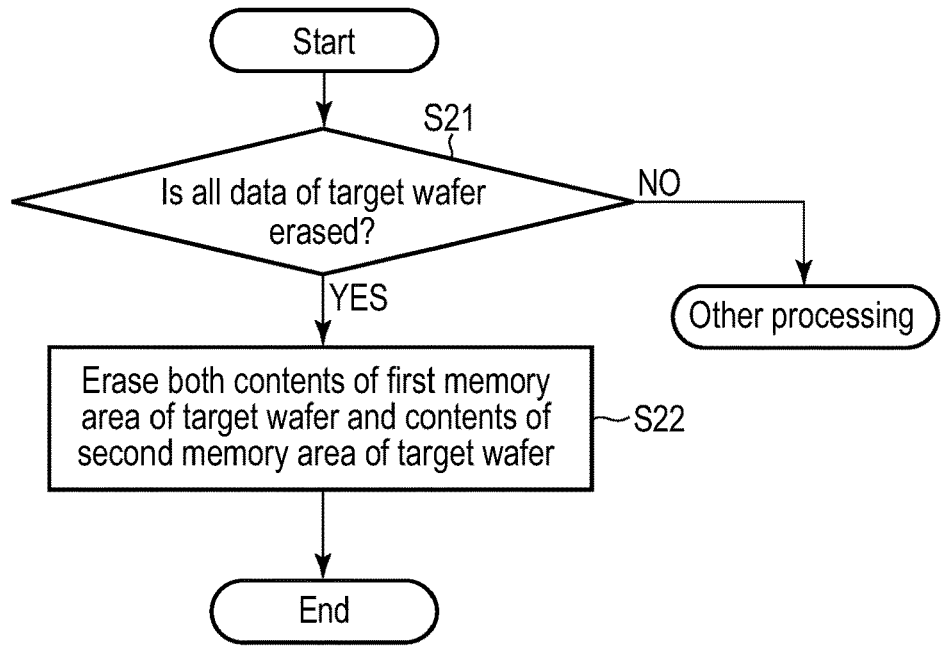
F I G. 10

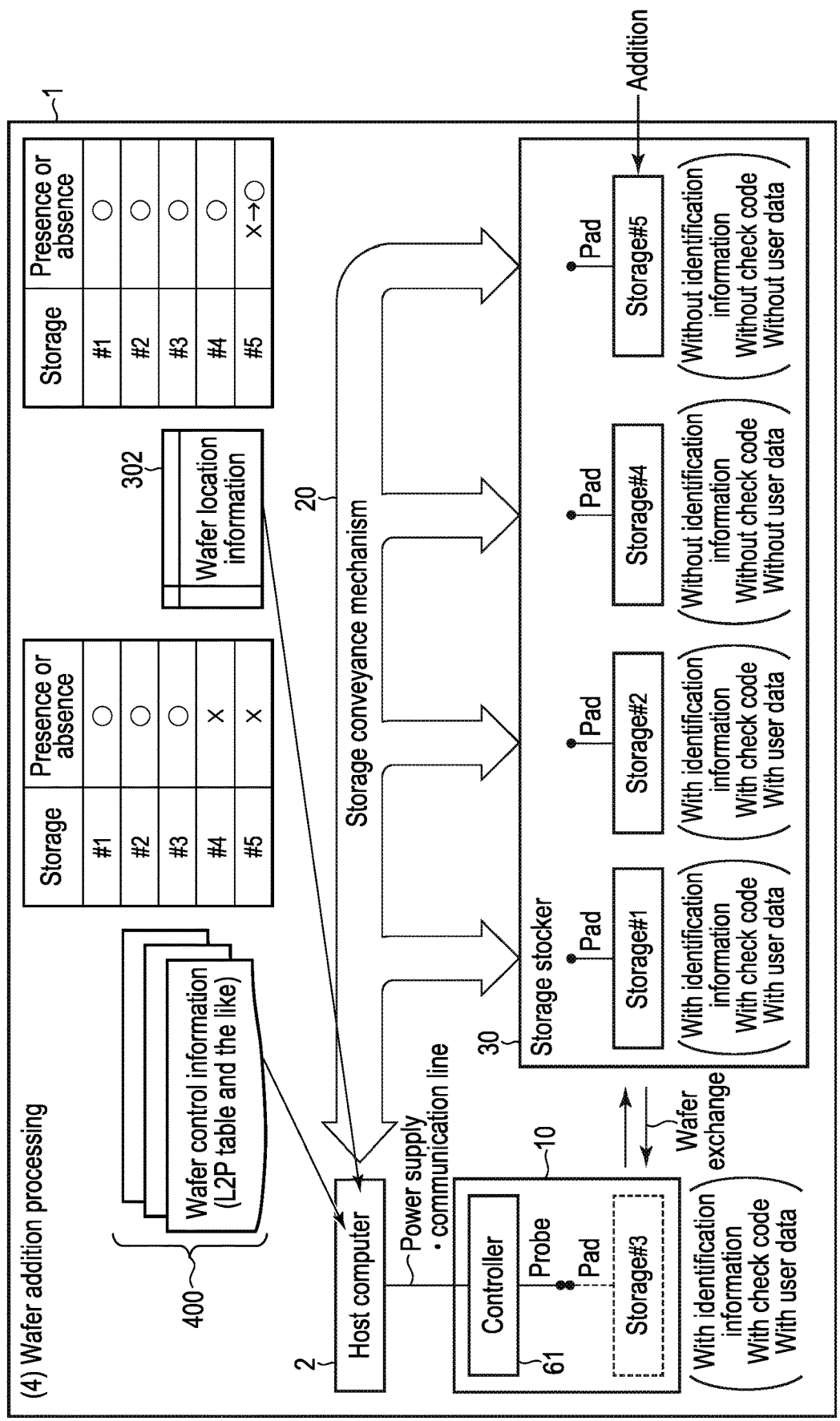
F I G. 22

STORAGE DEVICE AND STORAGE SYSTEM INCLUDING A MEMORY TO STORE A CHECK CODE FOR AN INTEGRITY CHECK

CROSS-REFERENCE TO RELATED APPLICATIONS

This application is a Continuation Application of PCT Application No. PCT/JP2019/044933, filed Nov. 15, 2019, the entire contents of which are incorporated herein by reference.

FIELD

Embodiments described herein relate generally to a storage device and a storage system that control a nonvolatile memory.

BACKGROUND

In recent years, a storage device that controls nonvolatile memory has become widespread.

As such a storage device, a solid state drive (SSD) including a NAND flash memory has been known. The SSD has been used in various computers.

Recently, there is a demand for the realization of a storage device having a larger storage capacity. Therefore, it is necessary to realize a new technology that makes it possible to increase the storage capacity of the storage device.

BRIEF DESCRIPTION OF THE DRAWINGS

FIG. 1 is a block diagram illustrating a configuration example of a storage system including a storage device according to an embodiment of the present invention.

FIG. 6 is a diagram illustrating a relationship between a reader & writer (prober) and the storage stocker included in the storage device.

FIG. 9 is a flowchart illustrating a procedure of data write/read processing executed in the controller.

FIG. 10 is a flowchart illustrating a procedure of processing of erasing all data in a semiconductor wafer executed in the controller.

FIG. 22 is a diagram for explaining the wafer addition processing executed in the storage system.

DETAILED DESCRIPTION

Figure 2:
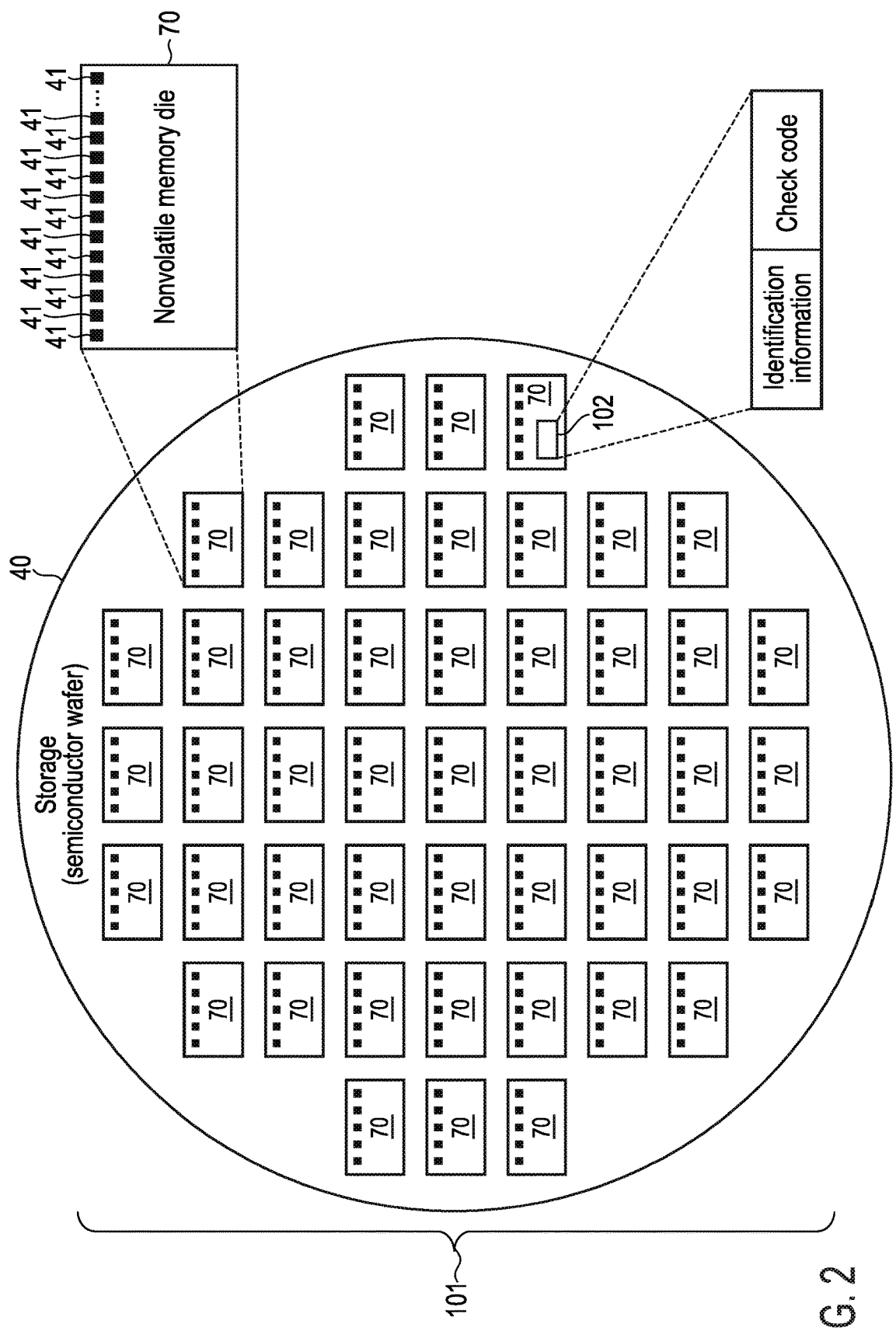
FIG. 2 is a diagram illustrating a configuration example of a semiconductor wafer used as a storage in the storage device.

In general, according to one embodiment, a storage device comprises: a stage on which a semiconductor wafer can be mounted, wherein data is capable of being read from the semiconductor wafer or data is capable of being written to the semiconductor wafer; a plurality of probe pins for reading or writing data; and a controller connected the probe pins. The semiconductor wafer comprises electrodes connectable to the probe pins; a first memory area that can store user data; and a second memory area that can store identification information for identification of the semiconductor wafer and a check code for checking integrity of the identification information. The controller is capable of reading the identification information and the check code from the second memory area.

Hereinafter, embodiments of the present invention will be described with reference to the drawings.

First, a structure of a storage system according to an embodiment of the present invention will be described below. FIG. 1 is a block diagram illustrating a configuration example of a storage system including a storage device according to an embodiment of the present invention.

A storage system 1 includes a host computer 2 and a storage device 3.

The host computer 2 is an information processing device that controls an operation of the storage device 3. The host computer 2 manages a wafer storage location where a semiconductor wafer 40 is stored.

The storage device 3 uses, as storage, the semiconductor wafer 40 including a plurality of nonvolatile memory dies. The storage device 3 is configured to write data to the nonvolatile memory die in the semiconductor wafer 40 and read data from the nonvolatile memory die in the semiconductor wafer 40.

Normally, a nonvolatile memory die formed on the semiconductor wafer is cut out as a chip by dicing and used as the storage (also called storage medium). On the other hand, the semiconductor wafer 40 itself including the plurality of nonvolatile memory dies is used as the storage. The semiconductor wafer 40 may be in a form from which the formed nonvolatile memory die is not cut out. Further, the semiconductor wafer 40 may be in a remount form formed by gathering the cut out nonvolatile memory dies.

The semiconductor wafer 40 includes a plurality of electrodes (hereinafter, referred to as pads) 41 that can be connected to the outside. More specifically, the plurality of pads 41 are a group of pads included in each of the plurality of nonvolatile memory dies in the semiconductor wafer 40. Each of the plurality of pads 41 is used to supply a power supply voltage and input/output a signal. The signal is, for example, a chip enable signal, a write enable signal, a read enable signal, a command latch enable signal, an address latch enable signal, a write protect signal, an I/O signal having a plurality of bit widths, a ready/busy signal RBn, and the like.

Each of the plurality of semiconductor wafers 40 includes a memory (first memory area) for storing user data and a memory (second memory area) for storing identification information for identifying the semiconductor wafer 40. The identification information for identifying the semiconductor wafer 40 and a check code for checking integrity of the identification information are stored in the second memory area.

The identification information may use any identifier (also referred to as a wafer ID) that can uniquely identify each semiconductor wafer. The identification information is issued by the host computer 2.

The check code is, for example, a cyclic redundancy code (CRC), another type of parity different from the CRC, a hash value calculated from the identification information, and the like. The integrity of the value read as the identification information from the second memory area can be checked by the check code. Therefore, it is possible to prevent a random value stored in a second memory area of a new semiconductor wafer 40 immediately after shipment from the factory from being mistakenly handled as identification information of another semiconductor wafer 40.

In each semiconductor wafer 40, a part of storage areas of some of the plurality of nonvolatile memory dies may be used as the second memory area. In this case, a set of other storage areas other than the some storage areas used as the second memory area may be used as the first memory area.

The storage device 3 includes a reader & writer (also called a prober) 10, a storage conveyance mechanism 20, and a storage stocker 30.

The reader & writer (also referred to as a prober) 10 writes and reads data to and from the semiconductor wafer 40 conveyed from the storage stocker 30 to the reader & writer (also referred to as a prober) 10 by the storage conveyance mechanism 20.

The reader & writer (prober) 10 includes a probe card 11, a stage 12, and a driver 13.

The probe card 11 has a surface 11A (here, lower surface) and a surface 11B (here, upper surface) opposite to the surface 11A. The surface 11A faces the semiconductor wafer 40 mounted on the stage 12.

A plurality of probe pins 51 are located on the surface 11A. Each probe pin 51 is used to supply an electrical signal to a pad 41 of the semiconductor wafer 40 mounted on the stage 12 or receive an electrical signal from the pad 41. The probe pin 51 is also referred to as a probe or a probe needle. The total number of probe pins 51 arranged on the surface 11A may be the same as the total number of pads 41 in the semiconductor wafer 40. In this case, the reader & writer (prober) 10 can be collectively connected to the pads 41 in the semiconductor wafer 40 via the probe card 11. This makes it possible to increase the number of nonvolatile memory dies that can be accessed in parallel.

A controller 61 is arranged on the surface 11B. The controller 61 is a memory controller configured to control the plurality of nonvolatile memory dies in the semiconductor wafer 40 mounted on the stage 12. The controller 61 may be realized by an LSI such as a system-on-a-chip (SoC). In FIG. 1, a configuration example in which the plurality of controllers 61 are arranged on the surface 11B of the probe card 11 is illustrated, but the number of controllers 61 arranged on the surface 11B may be one or more.

The controller 61 may function as a flash translation layer (FTL) configured to perform data management and lock management of each nonvolatile memory die in the semiconductor wafer 40. The data management executed by the FTL includes management or the like of mapping information indicating the correspondence between each of logical addresses and each of physical addresses. The logical address is an address used by the host computer 2 for addressing a location in a logical address space of the semiconductor wafer 40 to be accessed. The physical address which corresponds to a certain logical address points to a physical storage location in the nonvolatile memory die where data corresponding to this logical address is written. As the logical address, a logical block address (LBA) (addressing) can generally be used. The logical address of the semiconductor wafer 40 to be accessed is represented by, for example, a combination of the LBA and the identification information of the semiconductor wafer 40 to be accessed.

The stage 12 has a mechanism to hold the semiconductor wafer 40. The semiconductor wafer 40 conveyed from the storage stocker 30 to the reader & writer (prober) 10 by the storage conveyance mechanism 20 is mounted on the stage 12. The semiconductor wafer 40 mounted on the stage 12 can be replaced with any one of the plurality of semiconductor wafers 40 stored in the storage stocker 30 by the storage conveyance mechanism 20.

A driver 13 moves the probe card 11 or the stage 12 to bring the pads 41 of the semiconductor wafer 40 mounted on the stage 12 into contact with the probe pins 51 of the probe card 11. The pads 41 of the semiconductor wafer 40 and the probe pins 51 are in contact with each other, and as a result, the controller 61 and the semiconductor wafer 40 (the plurality of nonvolatile memory dies) are electrically connected to each other. For example, the driver 13 may be realized as an actuator capable of moving the stage 12 in three directions (X direction, Y direction, and Z direction) orthogonal to each other.

The storage conveyance mechanism 20 operates to convey the semiconductor wafer 40 between the storage stocker 30 and the stage 12 under the control of the host computer 2.

The storage conveyance mechanism 20 includes a support 21 and a tray 22.

The support 21 can move horizontally and vertically, respectively. Further, the support 21 is rotatable around a central axis along a longitudinal direction of the support 21.

The tray 22 is attached to an upper end portion of the support 21 and is used to transport the semiconductor wafer 40 to be conveyed.

The storage stocker 30 stores the plurality of semiconductor wafers 40, respectively. The storage stocker 30 includes a plurality of wafer storage locations. A user can add a new semiconductor wafer 40 to a vacant wafer storage location of the storage stocker 30 as needed. Therefore, storage capacity handled by the storage system 1 can easily increase in units of semiconductor wafers.

The semiconductor wafer 40 stored in the storage stocker 30 functions as an offline storage electrically separated from the controller 61. The semiconductor wafer 40 conveyed from the storage stocker 30 to the stage 12 by the storage conveyance mechanism 20 functions as an online storage that is electrically connected to the controller 61 via the probes 51.

Next, an operation of the storage system 1 according to the embodiment of the present invention will be described below.

The storage device 3 writes or reads data to or from the semiconductor wafer 40 (online storage) to be accessed under the control of the host computer 2.

The host computer 2 transmits a conveyance request to the storage device 3 that designates the wafer storage location where the semiconductor wafer 40 to be accessed is stored. Upon receiving the conveyance request, the storage conveyance mechanism 20 of the storage device 3 conveys the semiconductor wafer 40 of the designated wafer storage location in the storage stocker 30 to the reader & writer (prober) 10 and mounts the semiconductor wafer 40 on the stage 12. The reader & writer (prober) 10 writes or reads data to or from the semiconductor wafer 40 to be accessed which is mounted on the stage 12.

When the writing or reading of data to or from the semiconductor wafer 40 to be accessed is completed, the storage device 3 can store the semiconductor wafer 40 on the stage 12 in the wafer storage location in the storage stocker 30. Alternatively, the storage device 3 may continue to mount the semiconductor wafer 40 on the stage 12 until the storage device 3 receives the conveyance request for another semiconductor wafer 40.

When the semiconductor wafer 40 on the stage 12 is stored in the wafer storage location in the storage stocker 30, the host computer 2 transmits, to the storage device 3, a return request designating the wafer storage location in the storage stocker 30 in which the semiconductor wafer 40 on the stage 12 is to be stored. The host computer 2 transmits the return request to the storage device 3 when the writing or reading of data to or from the semiconductor wafer 40 to be accessed is completed, or for example, when it becomes impossible to write more user data to the first memory area. Upon receiving the return request, the storage conveyance mechanism 20 of the storage device 3 conveys the semiconductor wafer 40 on the stage 12 of the reader & writer (prober) 10 to the storage stocker 30, and stores the semiconductor wafer 40 in the specified wafer storage location.

Next, an operation of writing or reading data to or from the semiconductor wafer 40 to be accessed will be described in more detail.

In the storage stocker 30, the semiconductor wafer 40 to which data has already been written and the semiconductor wafer 40 to which data has not yet been written can coexist. Under the control of the host computer 2, the storage device 3 uses the identification information stored in the semiconductor wafer 40 to separately handle the semiconductor wafer 40 to which data has already been written and the semiconductor wafer 40 to which data has not yet been written.

When the set of the identification information and the check code having a correct correspondence is not stored in the second memory area of the semiconductor wafer 40 mounted on the stage 12, the semiconductor wafer 40 is a semiconductor wafer to which data has not yet been written. When the set of the identification information and the check code having the correct correspondence is stored in the second memory area of the semiconductor wafer 40 mounted on the stage 12, the semiconductor wafer 40 is a semiconductor wafer to which data has been already written.

When the set of the identification information and the check code having the correct correspondence is not stored in the second memory area of the semiconductor wafer 40 mounted on the stage 12, the controller 61 writes the identification information for identifying the semiconductor wafer 40 and the check code for checking the integrity of the identification information to the second memory area of the semiconductor wafer 40 based on a request from the host computer 2. Then, the controller 61 creates a logical-to-physical address translation table associated with the identification information. The logical-to-physical address translation table is used to manage the correspondence between logical addresses and physical addresses. In the following, the logical-to-physical address translation table is also referred to as an L2P table.

When the set of the identification information and the check code having the correct correspondence is stored in the second memory area of the semiconductor wafer 40 mounted on the stage 12, the controller 61 acquires the logical-to-physical address translation table associated with the identification information from the host computer 2. Alternatively, the logical-to-physical address translation table may be divided into two hierarchy, an upper table and a lower table. Further, the controller 61 may acquire the upper table of the logical-to-physical address translation table from the host computer 2 and may acquire the lower table from the semiconductor wafer 40.

The controller 61 controls the nonvolatile memory die in the semiconductor wafer 40 mounted on the stage 12, and writes or reads data to or from the semiconductor wafer 40 in response to receiving a write request (write command) or a read request (read command) from the host computer 2.

When the write request is received from the host computer 2, the controller 61 writes the user data included in the write request to the physical storage location in the first memory area of the semiconductor wafer 40. Then, the controller 61 updates the acquired L2P table so that the physical address indicating the physical storage location is associated with the logical address designated by the write request.

When the read request is received from the host computer 2, the controller 61 specifies the physical address corresponding to the logical address designated by the read request by referring to the acquired L2P table. Then, the controller 61 reads the user data from the first memory area of the semiconductor wafer 40 indicated by the specified physical address.

Next, a detailed configuration of the semiconductor wafer 40 according to an embodiment of the present invention will be described below. FIG. 2 is a diagram illustrating a configuration example of the semiconductor wafer 40 used as the storage in the storage device 3.

The semiconductor wafer 40 includes a plurality of nonvolatile memory dies 70. The size of the semiconductor wafer 40 is not limited, but may be a 300 mm wafer. In the case where the number of nonvolatile memory dies 70 included in a semiconductor wafer is 1024 and the storage capacity per nonvolatile memory die 70 is 32-G bytes, the storage capacity per semiconductor wafer is 32-T bytes. The nonvolatile memory die 70 has, for example, a rectangular shape, and one side thereof is provided with a plurality of pads 41 that can be connected to the outside.

A portion of the storage areas of one or some of the plurality of nonvolatile memory dies 70 included in the semiconductor wafer 40 is used as a second memory area 102. The second memory area 102 is used as a storage area for storing the identification information issued by the host computer 2 to identify the semiconductor wafer 40 and the check code for checking the integrity of the identification information. The check code for checking the integrity of certain identification information can be calculated from the identification information by mathematical calculation.

For example, the size of the identification information and the size of the check code corresponding to the identification information are predefined. In verification processing for determining whether or not the set of the identification information and the check code having the correct correspondence is stored in the second memory area 102, for example, a portion of a bit string read from the second memory area 102 is handled as the identification information, and the rest is handled as the check code. Note that an example of a data structure in which the identification information and the check code are stored in the second memory area 102 is not limited to this example, and various other data structures can be used.

In the semiconductor wafer 40, the storage area other than the second memory area 102 functions as the first memory area 101 for storing user data or management data. The management data includes, for example, wafer control information necessary for writing and reading data to or from the semiconductor wafer 40. Examples of the wafer control information include, for example, the logical-to-physical address translation table corresponding to the semiconductor wafer 40, defect information corresponding to the semiconductor wafer 40, and the like.

The first memory area 101 is used to store the user data. In addition, the first memory area 101 may be used to store both the user data and the management data for the semiconductor wafer 40. Note that the semiconductor wafer 40 may include a dedicated memory for storing the set of the identification information and the check code as the second memory area 102.

Figure 3:
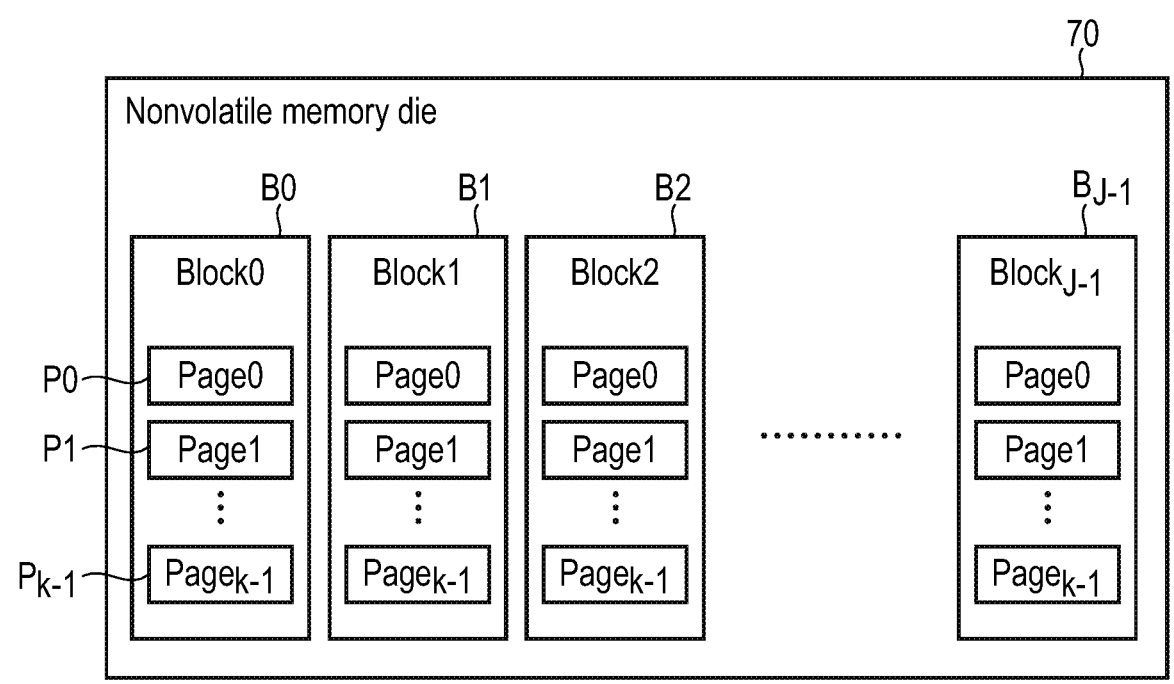
FIG. 3 is a diagram illustrating a configuration example of each of a plurality of nonvolatile memory dies included in a semiconductor wafer.

Next, a detailed configuration of the nonvolatile memory die 70 according to an embodiment of the present invention will be described. FIG. 3 is a diagram illustrating a configuration example of the plurality of nonvolatile memory dies 70 included in the semiconductor wafer 40.

Each of the plurality of nonvolatile memory dies 70 included in the semiconductor wafer 40 is, for example, a NAND flash memory die. The nonvolatile memory die 70 may be realized as a NAND flash memory having a two-dimensional structure or a NAND flash memory having a three-dimensional structure.

In the NAND flash memory, data can be written to a page only once per erase cycle. That is, new data cannot be directly overwritten in an area in a block to which the data has already been written. Therefore, in the case of updating (changing) the data that has already been written, the controller 61 writes new data (updated data) to an unused area (unwritten area) in the block (or another block) and handles previous data as invalid data. In other words, the controller 61 writes updated data corresponding to a certain logical address to another physical storage location, instead of the physical storage location where the previous data corresponding to the logical address is stored. Then, the controller 61 updates the L2P table to associate the logical address with the other physical storage location and invalidate the previous data.

A memory cell array of the nonvolatile memory die 70 includes a plurality of blocks (physical blocks) B0 to Bj−1. The blocks B0 to Bj−1 function as a unit for erasing operation.

The blocks B0 to Bj−1 include a plurality of pages (physical pages). That is, each of the blocks B0 to Bj−1 includes pages P0, P1, . . . , Pk−1. Each page includes a plurality of memory cells connected to the same word line. In each nonvolatile memory die, data read and data write are executed page by page.

Figure 4:
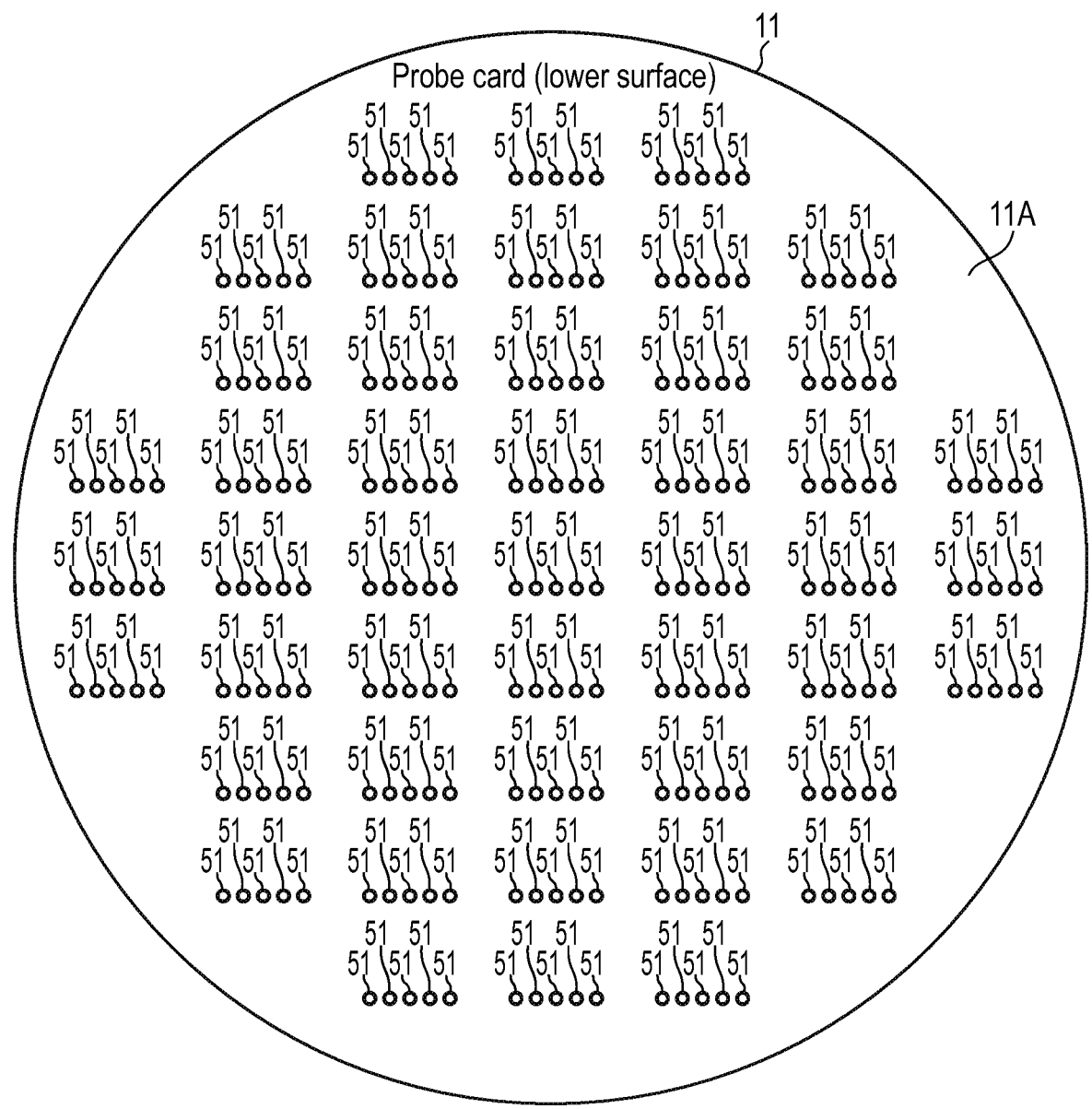
FIG. 4 is a diagram illustrating a plurality of probes arranged on a first surface of a probe card.

Next, the detailed configuration of the probe card 11 according to the embodiment of the present invention will be described with reference to FIGS. 4 and 5. FIG. 4 is a diagram illustrating a plurality of probes 51 arranged on a first surface 11A of the probe card 11.

FIG. 4 illustrates a case where the same number of probes 51 as the number of pads 41 of all the nonvolatile memory dies 70 of the semiconductor wafer 40 are arranged on the first surface 11A of the probe card 11.

In this case, the probe 51 of the probe card 11 collectively contacts all the pads 41 of all the nonvolatile memory dies 70 in the semiconductor wafer 40, and all the nonvolatile memory dies 70 can be controlled by the controller 61.

Figure 5:
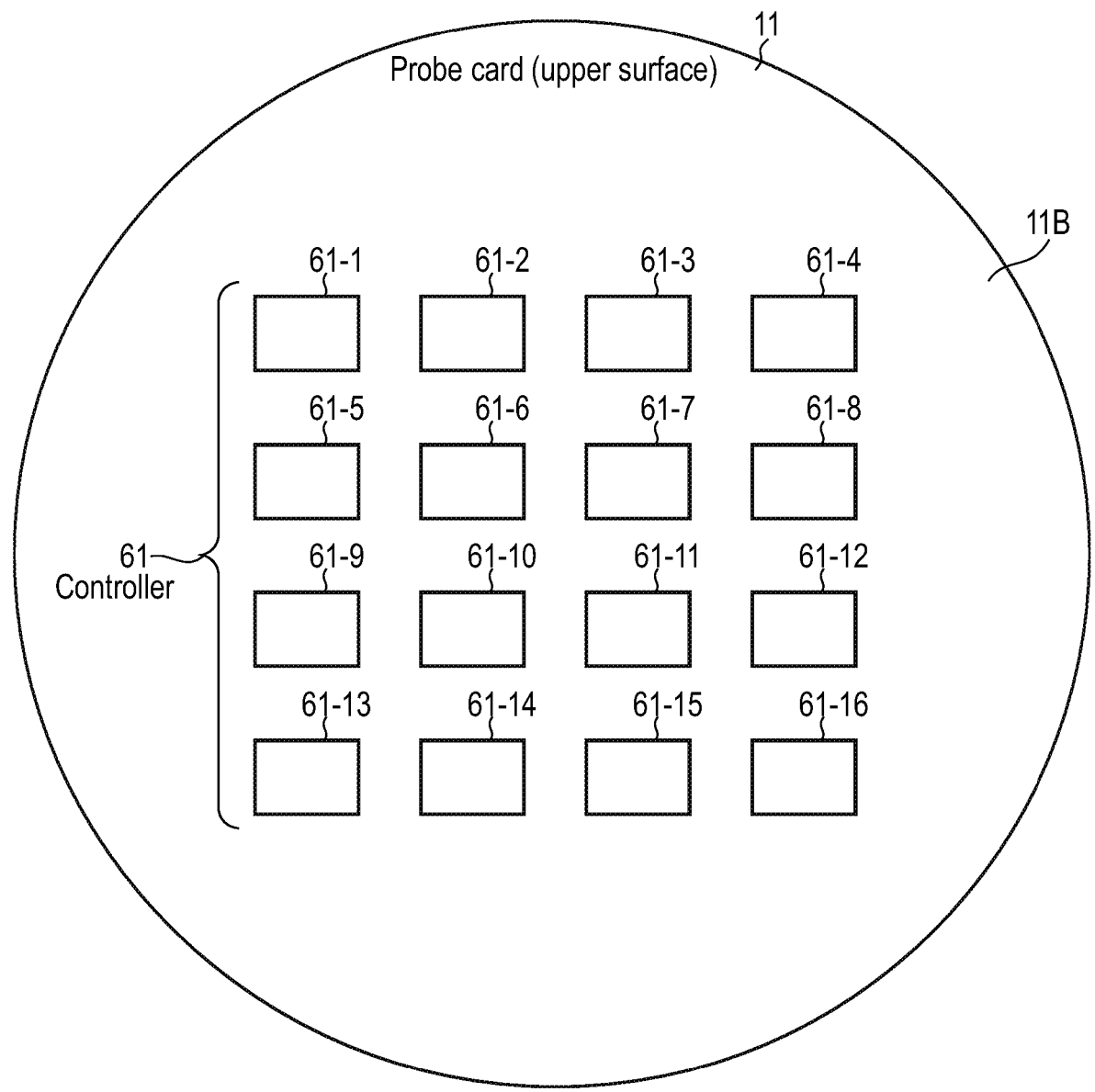
FIG. 5 is a diagram illustrating a plurality of memory controllers constituting a controller arranged on a second surface of the probe card.

FIG. 5 is a diagram illustrating a plurality of memory controllers constituting the controller 61 arranged on a second surface 11B of the probe card 11.

FIG. 5 illustrates the case where the controller 61 is realized by 16 memory controllers 61-1, 61-2, . . . , 61-16. In the case where a semiconductor wafer 40 includes 1024 nonvolatile memory dies 70, and 16 memory controllers 61-1, 61-2, . . . , 61-16 are arranged on the second surface 11B of the probe card 11, each memory controller may control 64 nonvolatile memory dies via the probes 51.

The memory controllers 61-1, 61-2, 61-16 may be connected to the host computer 2 via a switch circuit shared by the memory controllers 61-1, 61-2, . . . , 61-16.

Here, a detailed example of the operation of the storage system 1 according to the embodiment of the present invention will be described. FIG. 6 is a diagram illustrating the relationship between the reader & writer (prober) 10 and the storage stocker 30 which are included in the storage device 3.

FIG. 6 illustrates a case where storage #1 is mounted as online storage on the stage 12 of the reader & writer (prober) 10, and storage #2 and storage #3 are stored as offline storages in the storage stocker 30. The storage #2 is one of the semiconductor wafers with the identification information, and the storage #3 is one of the semiconductor wafers without the identification information.

The controller 61 reads the identification information and the check code from the second memory area of the semiconductor wafer conveyed to the reader & writer (prober) 10. Then, the host computer 2 or the controller 61 executes a verification processing for determining whether or not the correspondence between the identification information and the check code which are is correct.

When the semiconductor wafer (here, storage #2) with the identification information is conveyed to the reader & writer (prober) 10, it is determined that the correspondence between the identification information and the check code which are read is correct. In this case, the controller 61 acquires, from the host computer 2, the L2P table associated with the identification information stored in the second memory area of the semiconductor wafer (storage #2) with the identification information. Alternatively, the controller 61 acquires, from the storage #2, the L2P table associated with the identification information stored in the second memory area of the storage #2. Alternatively, when the L2P table associated with the identification information stored in the second memory area of the storage #2 is divided into the upper table and the lower table, the controller 61 may acquire the upper table from the host computer 2, and may acquire the lower table from the storage #2. Then, the controller 61 manages mapping between each of logical addresses and each of physical addresses in units of predetermined management size by using the acquired L2P table.

When the semiconductor wafer (here, storage #3) without the identification information is conveyed to the stage 12 of the reader & writer (prober) 10, it is determined that the correspondence between the identification information and the check code which are read is incorrect. In this case, the controller 61 writes the identification information issued by the host computer 2 and the check code for checking the integrity of the identification information to the second memory area of the storage #3, based on the request from the host computer 2. In the following, the check code for checking the integrity of the identification information is also referred to as the check code corresponding to the identification information.

The host computer 2 manages a plurality of defect information corresponding to the plurality of semiconductor wafers 40 with the identification information. The defect information associated with a certain semiconductor wafer 40 indicates defective blocks included in the plurality of nonvolatile memory dies in this semiconductor wafer 40. The controller 61 may acquire not only the L2P table associated with the identification information of the semiconductor wafer conveyed to the stage 12 but also the defect information associated with the identification information of the semiconductor wafer from the host computer 2 or a first storage area that does not include the defective block in the semiconductor wafer 40. Then, the controller 61 determines a write destination block to which the data from the host computer 2 is to be written based on the acquired defect information so that the defective block is not selected as the write destination block.

Figure 7:
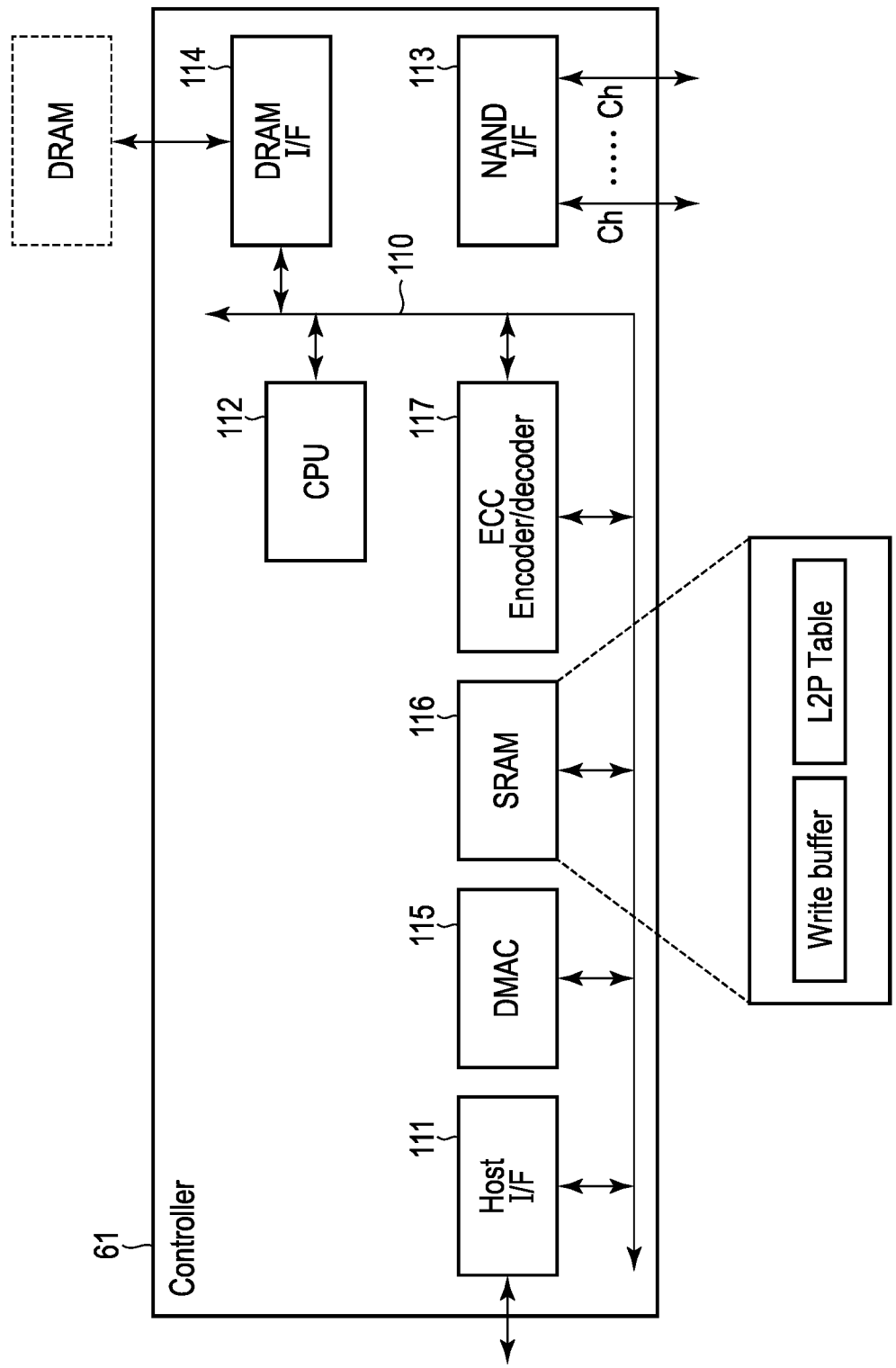
FIG. 7 is a block diagram illustrating a configuration example of a controller included in the prober.

Next, a detailed configuration of the controller 61 according to the embodiment of the present invention will be described. FIG. 7 is a block diagram illustrating a configuration example of the controller 61 included in the reader & writer (prober) 10.

The controller 61 includes a host interface circuit (host I/F) 111, a CPU 112, a NAND interface circuit (NAND I/F) 113, a dynamic RAM interface circuit (DRAM I/F) 114, a direct memory access controller (DMAC) 115, a static RAM (SRAM) 116, an ECC encoder/decoder 117. The host interface circuit 111, the CPU 112, the NAND interface circuit 113, the dynamic RAM interface circuit 114, the direct memory access controller 115, the static RAM 116, and the ECC encoder/decoder 117 are connected via a bus 110.

The host interface circuit 111 is configured to perform communication with the host computer 2. The host interface circuit 111 receives various commands from the host computer 2. These commands include a write command (write request), a read command (read request), an erase command (erase), and various other commands.

The write command is a command (write request) to write data to be written (write data) to the nonvolatile memory die in the semiconductor wafer, and includes a logical address (start LBA) to which the write data is to be written, a size (data length) of the write data, a data pointer (buffer address) indicating a location in the memory of the host computer 2 in which the write data is stored, and the like.

The read command is a read command (read request) to read data from the nonvolatile memory die in the semiconductor wafer, and includes the logical address (start LBA) corresponding to the data to be read, the size (data length) of the data, a data pointer (buffer address) indicating a location in a read buffer in the memory of the host computer 2 to which the read data is to be transferred, and the like.

The erase command is a command (erase request) to erase the data written to each nonvolatile memory die in the semiconductor wafer, and is used to put a memory cell group in each erase target block in the nonvolatile memory die into the erased state.

The CPU 112 is a processor configured to control the host interface circuit 111, the NAND interface circuit 113, the dynamic RAM interface circuit 114, the direct memory access controller 115, the static RAM 116, and the ECC encoder/decoder 117. The CPU 112 loads a control program (firmware) into the static RAM 116 from the ROM (not illustrated) in response to power-on of the storage device 3, and executes various processes by executing this firmware. The CPU 112 can execute command processing for processing various commands from the host computer 2, processing corresponding to the above-mentioned FTL, and the like.

The NAND interface circuit 113 is a memory control circuit configured to control each of nonvolatile memory dies under the control of the CPU 112.

The DRAM interface circuit 114 is a DRAM control circuit configured to control the DRAM under the control of the CPU 112. Note that when the DRAM is connected to the controller 61, the firmware may be loaded into the DRAM. In addition, a portion of a storage area of the DRAM may be used as the write buffer, and another portion of the storage area of the DRAM may be used to store the L2P table associated with the identification information of the semiconductor wafer 40.

The DMAC 115 performs data transfer between the memory of the host computer 2 and the static RAM 116 (or DRAM) under the control of the CPU 112.

A portion of the storage area of the static RAM 116 may be used as the write buffer for temporarily storing data to be written to the semiconductor wafer 40. Further, another portion of the storage area of the static RAM 116 may be used to store the L2P table associated with the identification information of the semiconductor wafer 40. A portion of the L2P table associated with the identification information of the semiconductor wafer 40 may be stored in the static RAM 116 as an L2P table cache.

When data is to be written to the nonvolatile memory die in the semiconductor wafer 40, the ECC encoder/decoder 117 adds an error correction code (ECC) to the data as a redundant code by encoding (ECC encoding) the data (data to be written). When data is read from the nonvolatile memory die in the semiconductor wafer 40, the ECC encoder/decoder 117 uses the ECC added to the read data to perform the error correction on the data (ECC decoding).

Figure 8:
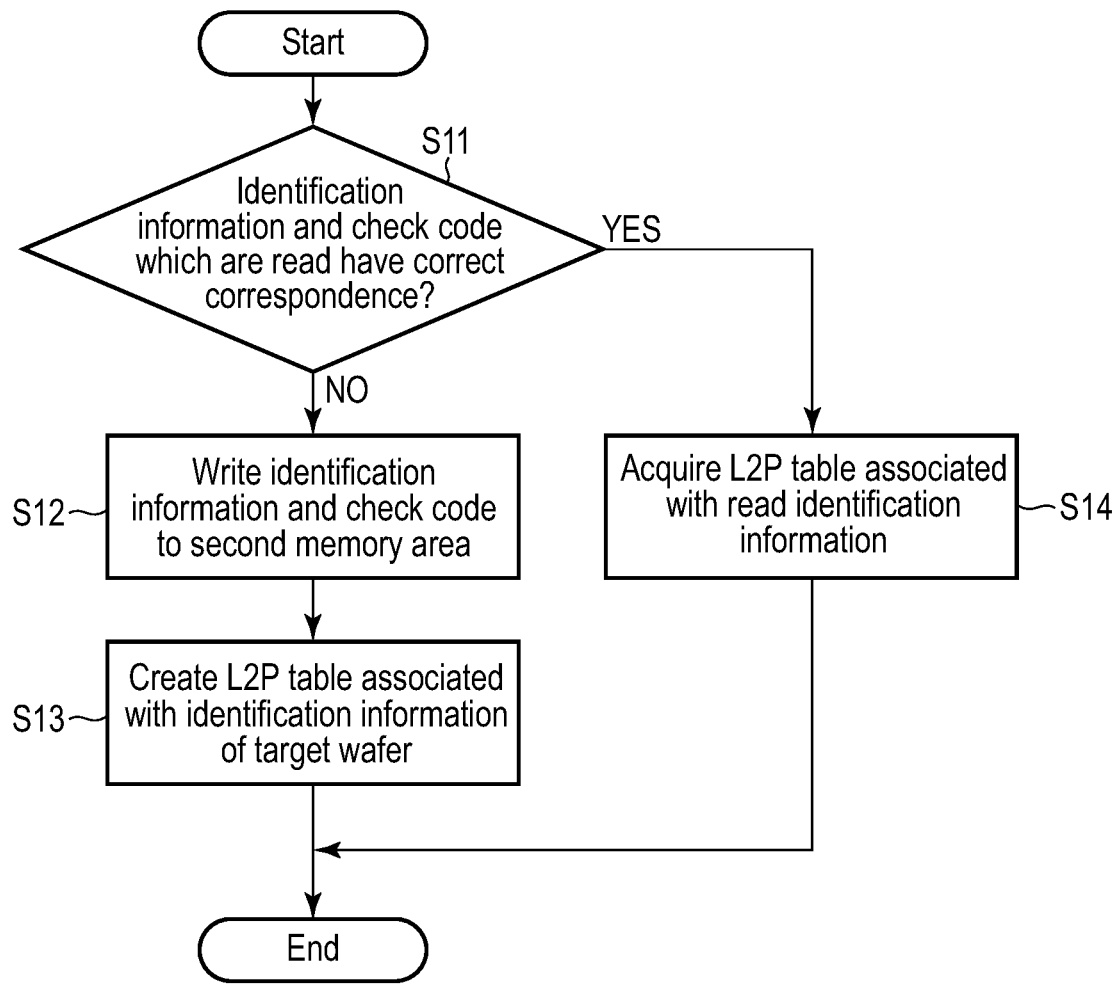
FIG. 8 is a flowchart illustrating a procedure of identification information write processing executed in the controller.

FIG. 8 is a flowchart illustrating a procedure of the identification information write processing executed in the controller 61.

When the semiconductor wafer 40 to be accessed is mounted on the stage 12 in the reader & writer (prober) 10 (start), the controller 61 reads the identification information and the check code of the second memory area of the semiconductor wafer 40 to be accessed. Then, the verification processing for determining whether or not the identification information and the check code which are read have the correct correspondence is executed (step S11). The verification processing may be executed by the controller 61 or by the host computer 2.

When the identification information and the check code which are read do not have the correct correspondence (that is, the target wafer is not the identified wafer) (NO in step S11), the controller 61 writes the identification information for identifying the semiconductor wafer 40 to be accessed and the check code corresponding to the identification information to the second memory area of the semiconductor wafer 40 to be accessed, based on the request from the host computer 2 (step S12). The identification information is issued by the host computer 2. The check code corresponding to the identification information may be issued by the host computer 2 or calculated from the identification information by the controller 61.

Then, the controller 61 creates the L2P table associated with the identification information of the semiconductor wafer 40 to be accessed (step S13), and ends the processing (end).

When the identification information and the check code which are read have the correct correspondence (that is, when the target wafer is the identified wafer) (YES in step S11), the controller 61 acquires the L2P table associated with the read identification information from the host computer 2 or the first memory area of the semiconductor wafer 40 to be accessed (step S14), and ends the processing (end). In step S14, the controller 61 may acquire the upper table of the L2P table associated with the read identification information from the host computer 2 and acquire the lower table from the first memory area of the semiconductor wafer 40 to be accessed.

Alternatively, in step S14, the controller 61 may acquire both the L2P table associated with the read identification information and the defect information associated with the read identification information from the host computer 2. Alternatively, in step S14, the controller 61 may acquire both the L2P table associated with the read identification information and the defect information associated with the read identification information from the first memory area of the semiconductor wafer 40 to be accessed.

Alternatively, in step S14, when the L2P table associated with the read identification information includes the upper table and the lower table, the controller 61 may acquire the upper table from the host computer 2 and acquire both the lower table and the defect information associated with the read identification information from the first memory area of the semiconductor wafer 40 to be accessed.

FIG. 9 is a flowchart illustrating a procedure of the data write processing and the data read processing executed in the controller 61.

Upon receiving a request from the host computer 2 (start), the controller 61 determines whether the received request is either a write request or a read request (step S15).

When the received request is the write request ("write request" in step S15), the controller 61 writes the write data (data from host computer 2) to the physical storage location in the first memory area of the semiconductor wafer 40 to be accessed (step S16). In step S16, the controller 61 determines the physical storage location where the data should be written so that the defective block indicated by the acquired defect information is not selected as the write destination block.

Then, the controller 61 updates the L2P table associated with the identification information of the semiconductor wafer 40 to be accessed so that the physical address indicating the physical storage location where the write data is written is associated with the logical address designated by the write request (step S17) and ends the processing (end).

When the received request is the read request ("read request" in step S15), the controller 61 specifies the physical address corresponding to the logical address designated by the read request by referring to the L2P table associated with the identification information of the semiconductor wafer 40 to be accessed (step S18). The physical address indicates the physical storage location in the first memory area where the read target data is stored.

Based on the specified physical address, the controller 61 reads the read target data from the physical storage location in the first memory area (step S19), transmits the read target data to the host computer 2, and ends the processing (end).

In the present embodiment, the semiconductor wafer whose identification information and check code stored in the second memory area do not have the correct correspondence is recognized as the wafer without the identification information. Therefore, it is possible to prevent a new semiconductor wafer immediately after the shipment from the factory from being mistakenly handled as the semiconductor wafer with the identification information.

In this way, by writing the identification information and the check code corresponding to the identification information to the second memory area of the semiconductor wafer, the semiconductor wafer to which data has already been written and the new semiconductor wafer immediately after the shipment from the factory can be correctly distinguished. When the identification information and the check code corresponding to the identification information are written to the second memory area of the new semiconductor wafer immediately after the shipment from the factory, it is possible to write and read the data to or from the semiconductor wafer.

Therefore, the user can easily increase the storage capacity that can be handled by the storage system 1 simply by adding the new semiconductor wafer immediately after the shipment from the factory to the storage stocker 30.

In addition, when the set of identification information and check code having the correct correspondence is already stored in the second memory area of the semiconductor wafer to be accessed which is conveyed to the stage 12, it is determined that the semiconductor wafer to be accessed is the wafer (semiconductor wafer with the identification information) to which data has already been written, and the L2P table associated with the identification information of the semiconductor wafer to be accessed is acquired from the host computer 2 or the semiconductor wafer to be accessed. Therefore, since the controller 61 can refer to or update the correct L2P table corresponding to the identification information of the semiconductor wafer to be accessed, the controller 61 can correctly manage the correspondence between each of the logical addresses used to access the semiconductor wafer to be accessed and each of the physical addresses of the target wafer, and further, correctly read the read target data designated by the host computer 2 from the semiconductor wafer to be accessed.

In addition, when the L2P table associated with the identification information of the semiconductor wafer to be accessed is acquired from the host computer 2, compared to reading the L2P table from the semiconductor wafer to be accessed, the L2P table can be quickly prepared on the SRAM 116 (or DRAM) of controller 61 and the data read/write performance can be increased.

Furthermore, the host computer 2 manages a plurality of pieces of identification information corresponding to the plurality of semiconductor wafers to each of which the identification information and the check code are written, and is allowed to write data to the first memory area of the semiconductor wafer conveyed to the stage 12 and read data from the first memory area of the semiconductor wafer conveyed to the stage 12 when the condition that the set of identification information and check code having the correct correspondence is stored in the second memory area of the semiconductor wafer conveyed from storage stocker 30 to the stage 12 by the storage conveyance mechanism 20, and the identification information stored in the second memory area of the semiconductor wafer conveyed to the stage 12 matches the identification information of the semiconductor wafer to be accessed designated by the host computer 2 is satisfied.

This can prevent data from being written or read to or from the unintended semiconductor wafer even when an unintended semiconductor wafer different from the semiconductor wafer to be accessed that is designated by the host computer 2 is conveyed from storage stocker 30 to the stage 12.

FIG. 10 is a flowchart illustrating a procedure of processing of erasing all the data in the semiconductor wafer executed in the controller 61.

When the set of identification information and check code having the correct correspondence is already stored in the second memory area of the semiconductor wafer (target wafer) conveyed to the stage 12, the controller 61 erases both the contents of the first memory area of the target wafer and the contents of the second memory area of the target wafer when erasing all the data in the target wafer based on the request (erase request) from the host computer 2. As a result, the semiconductor wafer with the identification information can be reused as the semiconductor wafer without the identification information.

For example, the host computer 2 may transmit the erase request for erasing all the data of the target wafer to the controller 61.

When the controller 61 receives the erase request from the host computer 2 for erasing all the data of the target wafer (YES in step S21), the controller 61 erases both the contents of the first memory area of the target wafer and the contents of the second memory area of the target wafer (step S22).

In this way, the host computer 2 transmits the erase request for erasing all the data of the target wafer to the controller 61, so the controller 61 can erase both the contents of the first memory area of the target wafer and the contents of the second memory area of the target wafer.

Figure 11:
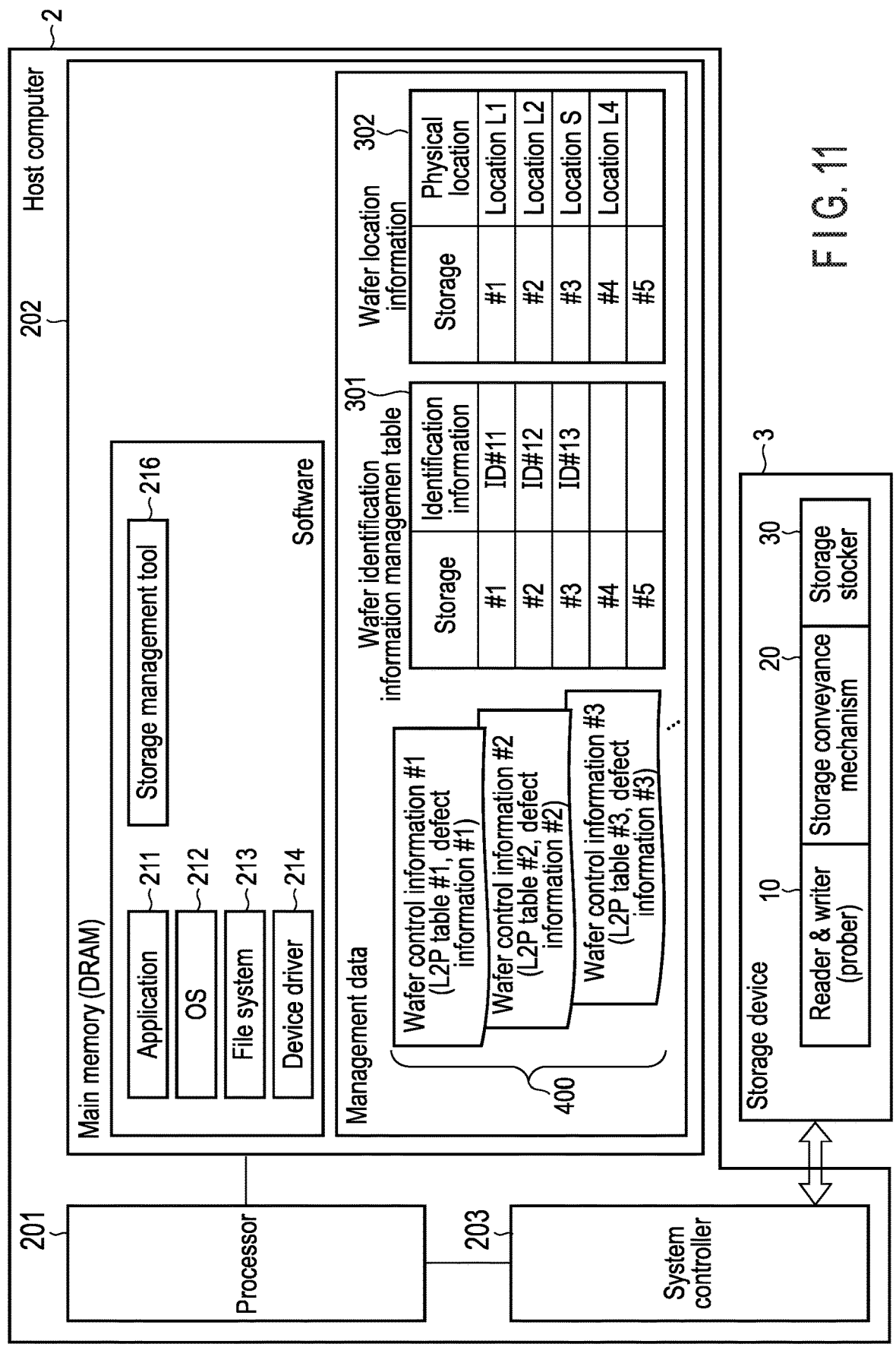
FIG. 11 is a block diagram illustrating a configuration example of a host computer.

FIG. 11 is a block diagram illustrating a configuration example of the host computer 2.

The host computer 2 includes a processor 201, a main memory 202, a system controller 203, and the like.

The processor 201 executes various-software loaded in the main memory 202 (for example, DRAM). These software may include, for example, an application program 211, an operating system (OS) 212, a file system 213, a device driver 214 for controlling the storage device 3, a storage management tool 216 for enabling a user to manage setting of storage device 3 and the like, and the like.

In addition, the host computer 2 can manage a wafer identification information management table 301, wafer location information 302, and wafer control information 400 corresponding to each semiconductor wafer with the identification information as management data for the plurality of semiconductor wafers 40 in the storage stocker 30. As illustrated in FIG. 11, the wafer identification information management table 301, the wafer location information 302, and the wafer control information 400 may be stored in the main memory 202. At least a portion of the wafer control information 400 corresponding to a certain semiconductor wafer 40 may be stored in the first storage area of the semiconductor wafer 40.

The host computer 2 is configured to issue unique identification information for each semiconductor wafer 40. The host computer 2 manages the identification information of each storage by using the wafer identification information management table 301. FIG. 11 illustrates the case where the storage #1, the storage #2, and the storage #3 are semiconductor wafers with the identification information and storage #4 is a semiconductor wafer without the identification information. In this case, in the wafer identification information management table 301, identification information (wafer ID #11) written to the second memory area of the storage #1, identification information (wafer ID #12) written to the second memory area of the storage #2, and identification information (wafer ID #13) written to the second memory area of the storage #3 are managed.

In addition, the host computer 2 is configured to use the wafer location information 302 to manage location information indicating a physical location (current physical location) in which each of the semiconductor wafers stored in the storage stocker 30 exists. The physical location of each semiconductor wafer indicates a location on one of a plurality of wafer storage locations in the storage stocker 30 or a location on the stage 12.

For example, in the case where the storage #1 exists in a first wafer storage location in the storage stocker 30, the storage #2 exists in a second wafer storage location in storage stocker 30, the storage #3 exists in the stage 12 by being conveyed from a third wafer storage location in the storage stocker 30 to the stage 12, and the storage #4 exists in the fourth wafer storage location in the storage stocker 30, in the wafer location information 302, a physical location L1 indicating the first wafer storage location in the storage stocker 30 is stored as the physical location of the storage #1, a physical location L2 indicating the second wafer storage location in the storage stocker 30 is stored as the physical location of the storage #2, a physical location S indicating the location on the stage 12 is stored as the physical location of the storage #3, and a physical location L4 indicating the fourth wafer storage location in the storage stocker 30 is stored as the physical location of the storage #4.

When the storage #1, the storage #2, and the storage #3 are the semiconductor wafers with the identification information, the host computer 2 manages wafer control information #1 required to write and read data to and from the storage #1, wafer control information #2 required to write and read data to and from the storage #2, and wafer control information #3 required to write and read data to and from the storage #3.

The wafer control information #1 is associated with the identification information (wafer ID #11) of the semiconductor wafer used as the storage #1. The wafer control information #2 is associated with the identification information (wafer ID #12) of the semiconductor wafer used as the storage #2. The wafer control information #3 is associated with the identification information (wafer ID #13) of the semiconductor wafer used as the storage #3.

The wafer control information #1 may include L2P table #1 associated with the wafer ID #11 and defect information #1 associated with the wafer ID #11. The L2P table #1 is a logical-to-physical address translation table for managing the mapping between each of logical address used by the host computer 2 to access the storage #1 and each of physical address in the storage #1. The defect information #1 indicates each defective block included in the plurality of nonvolatile memory dies in the storage #1.

The wafer control information #2 may include L2P table #2 associated with the wafer ID #12 and defect information #2 associated with the wafer ID #12. The L2P table #2 is a logical-to-physical address translation table for managing the mapping between each of logical address used by the host computer 2 to access the storage #2 and each of physical address in the storage #2. The defect information #2 indicates each defective block included in the plurality of nonvolatile memory dies in the storage #2.

The wafer control information #3 may include L2P table #3 associated with the wafer ID #13 and defect information #3 associated with the wafer ID #13. The L2P table #3 is a logical-to-physical address translation table for managing the mapping between each of logical address used by the host computer 2 to access the storage #3 and each of physical address in the storage #3. The defect information #3 indicates each defective block included in the plurality of nonvolatile memory dies in the storage #3.

Note that the wafer control information corresponding to each storage (semiconductor wafer) may further include information indicating a write voltage to be used in a write operation for each nonvolatile memory die of the corresponding semiconductor wafer and a read voltage to be used in a read operation for each nonvolatile memory die of the corresponding semiconductor wafer.

Figure 12:
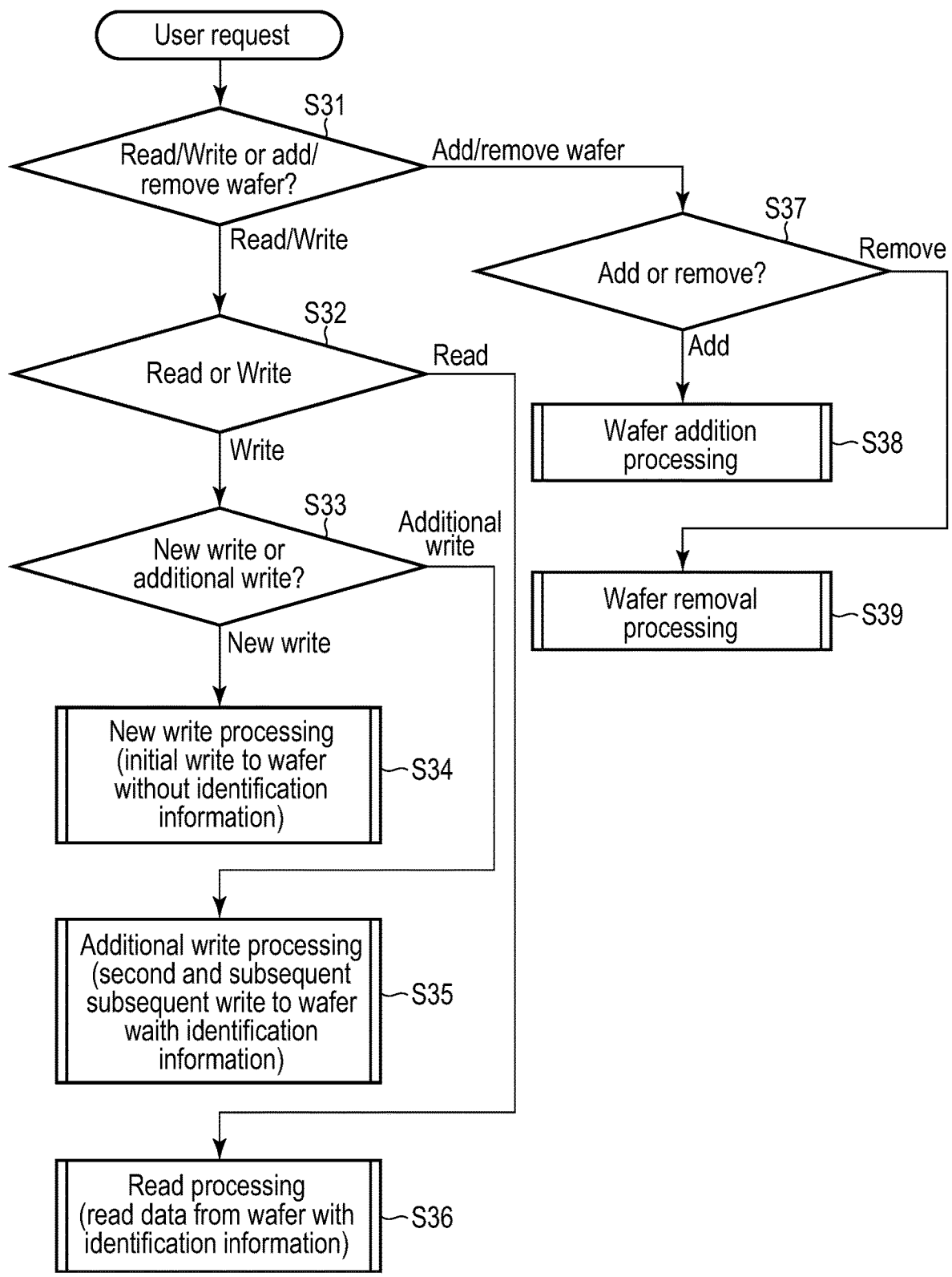
FIG. 12 is a flowchart illustrating conditions under which each of new write processing, additional write processing, read processing, wafer addition processing, and wafer removal processing controlled by the host computer should be executed.

FIG. 12 is a flowchart illustrating the conditions under which each of the "new write processing", "additional write processing", "read processing", "wafer addition processing", and "wafer removal processing" controlled by the host computer 2 should be executed.

The "new write processing" means initial write processing for writing data to the semiconductor wafer without the identification information for the first time. The semiconductor wafer without the identification information is, for example, a new semiconductor wafer immediately after the shipment from the factory. No meaningful data is written to the first memory area of the new semiconductor wafer immediately after the shipment from the factory, and no meaningful data (identification information and the like) is written to the second memory area.

The "additional write processing" means the second and subsequent write processing for writing data to the semiconductor wafer with the identification information again by conveying the semiconductor wafer with the identification information from the storage stocker 30 to the stage 12 again.

The "read processing" means processing of reading data from the semiconductor wafer with the identification information.

The "wafer addition processing" means processing of adding management information necessary to manage the new semiconductor wafer immediately after the shipment from the factory which is added to the storage stocker 30 by the user.

The "wafer removal processing" means processing of deleting the management information corresponding to the semiconductor wafer removed by the user from the storage stocker 30.

Hereinafter, the conditions under which each of the "new write processing", the "additional write processing", the "read processing", the "wafer addition processing", and the "wafer removal processing" should be executed will be described with reference to the flowchart of FIG. 12.

For example, when the request from the user (or application program) is the read/write request to/from the storage device 3 ("read/write" in step S31), it is determined by the host computer 2 whether the read/write request is the write request or the read request (step S32).

When the read/write request is the write request ("write" in step S32), it is determined by the host computer 2 whether the write request is a write to a semiconductor wafer without identification information (new write) or a write (additional write) to the semiconductor wafer with the identification information (step S33).

When the write request is the new write ("new write" in step S33), the procedure of the "new write processing" is executed by the host computer 2 (step S34).

When the write request is the additional write ("additional write" in step S33), the procedure of the "additional write processing" is executed by the host computer 2 (step S35).

When the read/write request is the read request ("Read" in step S32), the procedure of the "read processing" is executed by the host computer 2 (step S36).

When the request from the user (or application program) is the wafer addition/removal request ("wafer addition/removal" in step S31), it is determined by the host computer 2 whether the wafer addition/removal request is the wafer addition request or the wafer removal request (step S37).

When the wafer addition/removal request is the wafer addition request ("addition" in step S37), the procedure of the "wafer addition processing" is executed by the host computer 2 (step S38).

When the wafer addition/removal request is the wafer removal request ("removal" in step S37), the procedure of the "wafer removal processing" is executed by the host computer 2 (step S39).

Figure 13:
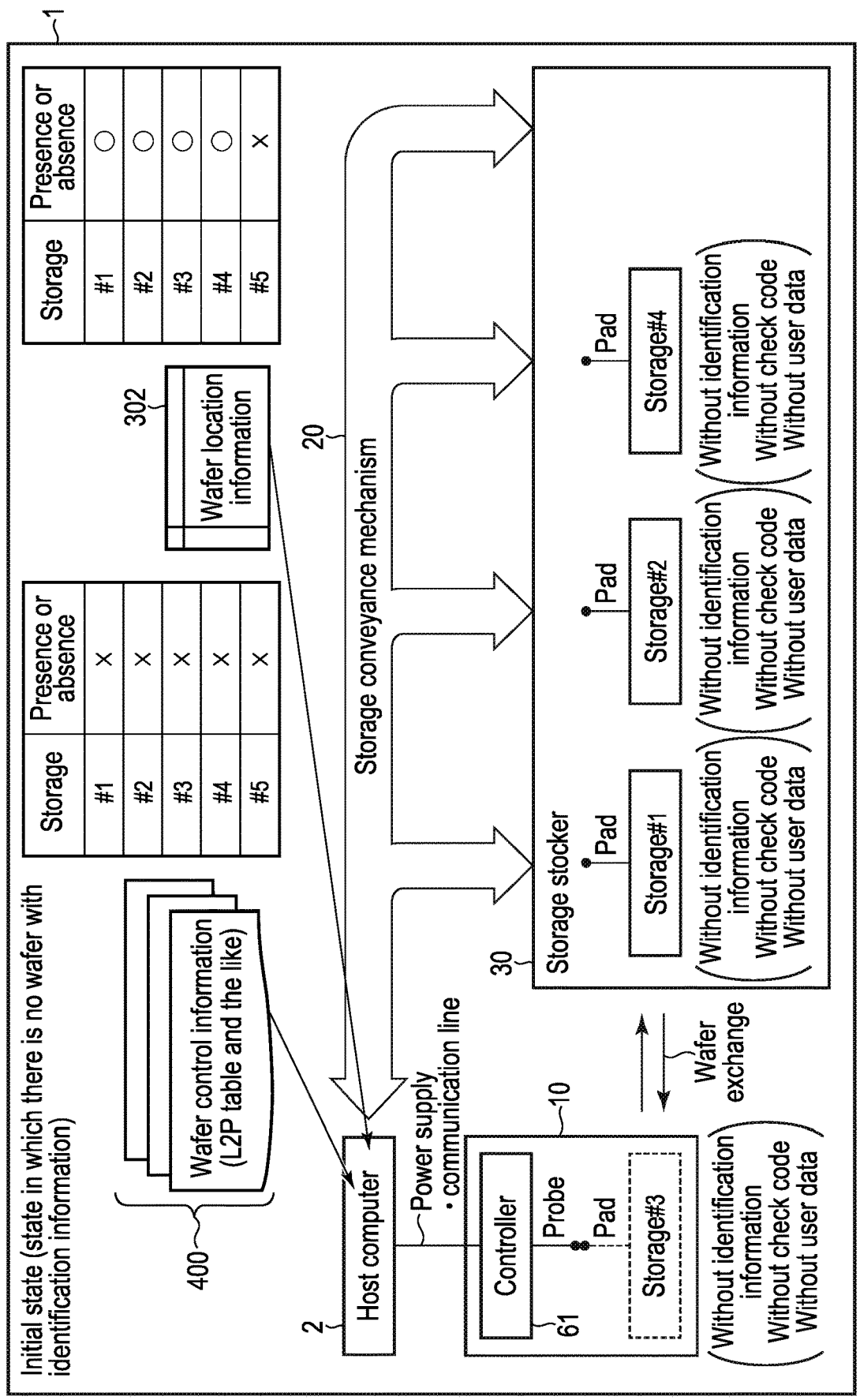
FIG. 13 is a block diagram illustrating a storage system in an initial state in which a semiconductor wafer with identification information does not exist.

FIG. 13 is a block diagram illustrating the storage system 1 in an initial state in which a semiconductor wafer with identification information does not exist.

In FIG. 13, each of the storage #1, the storage #2, the storage #3, and the storage #4 is the semiconductor wafer (new semiconductor wafer immediately after the shipment from the factory) without the identification information. No identification information is stored in each of the second memory areas of the storage #1, the storage #2, the storage #3, and the storage #4, and no check code is stored. No user data is written in the first memory areas of each of the storage #1, the storage #2, the storage #3, and the storage #4.

The storage #1, the storage #2, and the storage #4 exist in the first wafer storage location, the second wafer storage location, and the fourth wafer storage location in the storage stocker 30, respectively, and the storage #3 exists on the stage 12.

In the wafer location information 302 managed by the host computer 2, the physical locations where the storage #1, the storage #2, the storage #3, and the storage #4 respectively exist are managed.

The wafer control information (L2P table, and the like) corresponding to the storage #1, the storage #2, the storage #3, and the storage #4, respectively, does not exist.

Figure 14:
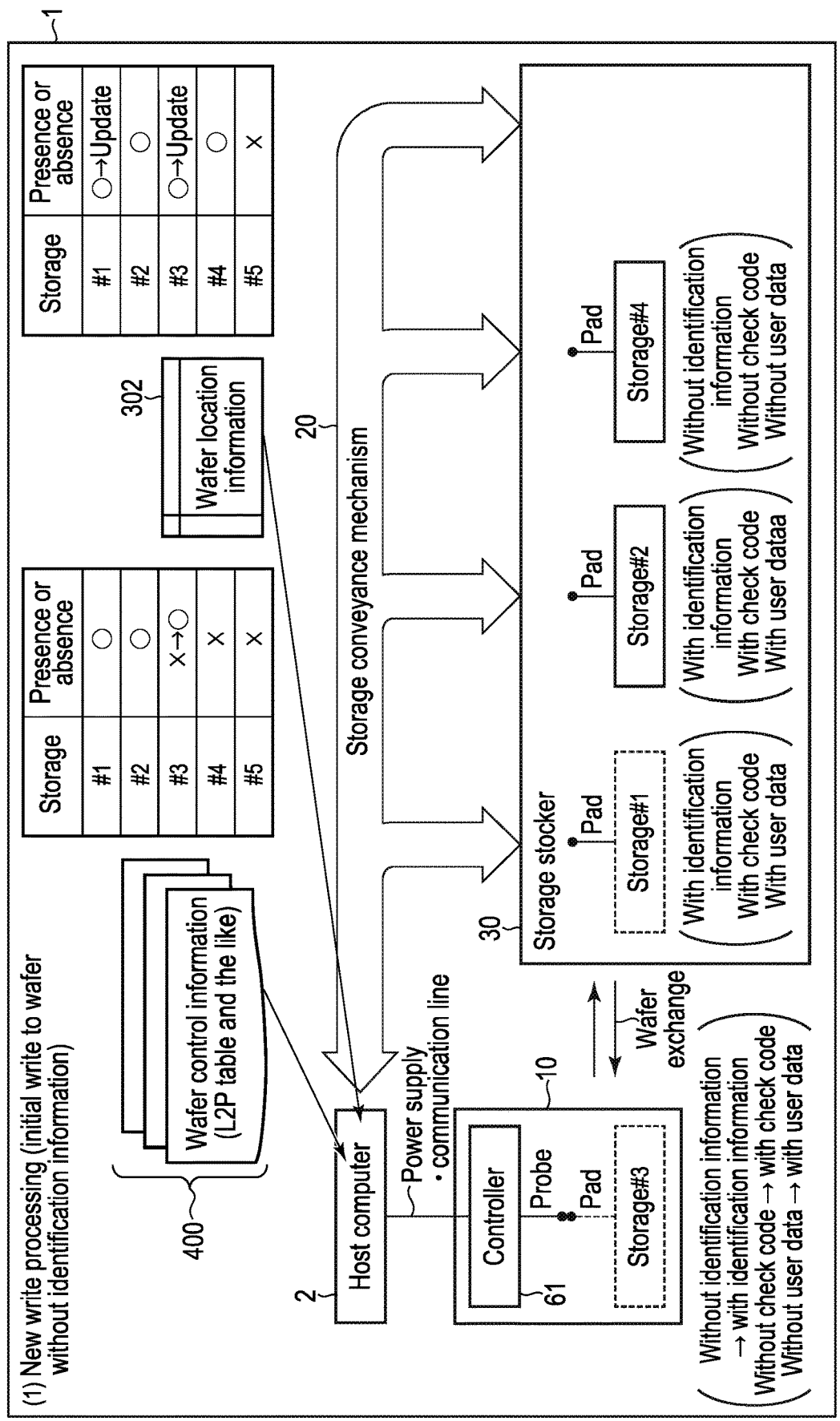
FIG. 14 is a diagram for explaining the new write processing executed in the storage system.

FIG. 14 is a diagram for explaining the "new write processing" executed in the storage system 1.

FIG. 14 illustrates a case where the "new write processing" for the storage #3 is started after the "new write processing" for storage #2 and the "new write processing" for the storage #1 are executed.

Each of the storage #1 and the storage #2 for which the "new write processing" is executed becomes the semiconductor wafer with the identification information. The identification information and the check code corresponding to the identification information are stored in the second memory areas of the storage #1 and the storage #2, respectively. In addition, the user data is written to each first memory area of the storage #1 and the storage #2 by the "new write processing".

Each of the storage #3 and the storage #4 is the semiconductor wafer without the identification information. No identification information is stored in the second memory areas of each of the storage #3 and the storage #4, and no check code is stored. No user data is written in the first memory areas of each of the storage #3 and the storage #4.

After the execution of the "new write processing" for the storage #1 is completed, the storage #1 returns from the stage 12 in the reader & writer (prober) 10 to the first wafer storage location in the storage stocker 30 where the storage #1 originally exists, and instead, the storage #3 is conveyed from the storage stocker 30 to the stage 12 as the semiconductor wafer where the "new write processing" should be executed.

In this case, in the wafer location information 302, the physical location of the storage #1 and the physical location of the storage #3 are updated. The physical location of the storage #1 indicated by the wafer location information 302 is updated from the location on the stage 12 to the first wafer storage location in the storage stocker 30.

The physical location of the storage #3 indicated by the wafer location information 302 is updated from the third wafer storage location in the storage stocker 30 to the location on the stage 12.

Under the control of the host computer 2, the controller 61 reads the identification information and the check code from the second memory area of the storage #3. Then, the verification processing of determining whether the correspondence between the read identification information and the read check code is correct is executed. The verification processing may be executed by either host computer 2 or controller 61, but the case where host computer 2 executes the verification processing is illustrated below.

The host computer 2 executes the verification processing, and determines whether the correspondence between the read identification information and the read check code is correct.

When the correspondence between the read identification information and the read check code is correct, it is determined that the read identification information is correct.

When the correspondence between the read identification information and the read check code is incorrect, it is determined that the read identification information is incorrect.

When the read identification information is incorrect, that is, when it is confirmed that the set of identification information and check code having the correct correspondence is not stored in the second memory area of the storage #3, the host computer 2 issues identification information for identifying the storage #3.

Then, the host computer 2 writes the issued identification information and the check code corresponding to the issued identification information to the second memory area of the storage #3 by using the controller 61. As a result, the host computer 2 is allowed to write data (user data) to the first memory area of the storage #3, and thus creates the wafer control information associated with the identification information of the storage #3.

The created wafer control information includes the L2P table and the like corresponding to the storage #3. The host computer 2 loads the wafer control information corresponding to the storage #3 (L2P table and the like corresponding to the storage #3) into the controller 61, or the controller 61 acquires the wafer control information (L2P table and the like corresponding to the storage #3) corresponding to the storage #3 from the host computer 2 or the first memory area of the storage #3, so the wafer control information (L2P table and the like corresponding to the storage #3) corresponding to the storage #3 is stored in the SRAM 116 (or DRAM) of the controller 61.

Next, the controller 61 writes the data from the host computer 2 to the first memory area of the storage #3 in response to receiving the write request from the host computer 2. Then, the controller 61 updates the L2P table corresponding to the storage #3.

Figure 15:
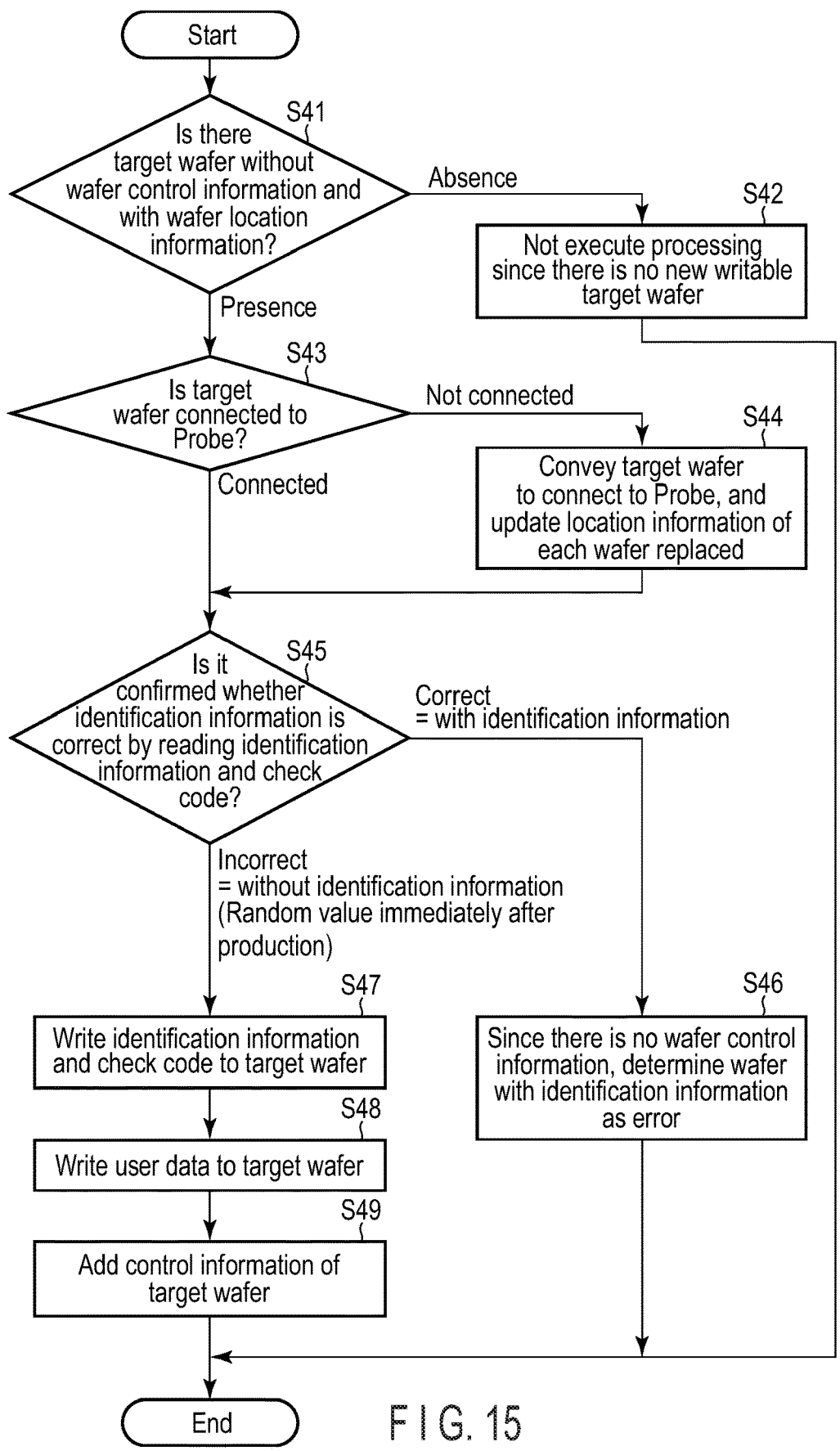
FIG. 15 is a flowchart illustrating a procedure of the new write processing controlled by the host computer.

FIG. 15 is a flowchart illustrating the procedure of the new write processing controlled by the host computer.

The host computer 2 determines whether or not there is a target wafer without the wafer control information and with the wafer location information (step S41). Here, the target wafer without the wafer control information and with the wafer location information means the semiconductor wafer in which the corresponding wafer control information 400 does not exist and the physical location is managed by the wafer location information 302.

When the target wafer without the wafer control information and with the wafer location information does not exist ("does not exist" in step S41), the host computer 2 determines that the target wafer cannot be processed since there is no target wafer on which new write processing can be executed (step S42), and ends the processing (end).

When there is a target wafer without the wafer control information and with the wafer location information ("existing" in step S41), the host computer 2 determines whether the target wafer is connected to the probes 51 based on the physical location of the target wafer indicated by the wafer location information 302 (step S43).

When the physical location of the target wafer indicates the location on the stage 12, it is determined that the target wafer is connected to the probes 51. On the other hand, when the physical location of the target wafer indicates a certain wafer storage location in the storage stocker 30, it is determined that the target wafer is not connected to the probes 51.

When the target wafer is not connected to the probes 51 ("not connected" in step S43), the host computer 2 controls the storage device 3 (storage conveyance mechanism 20) to replace the storage existing on the stage 12 with the target wafer in the storage stocker 30, thereby connecting the target wafer to the probes 51 (step S44). In step S44, the host computer 2 may transmit a conveyance request to the storage device 3 that designates the wafer storage location in the storage stocker 30 where the target wafer is stored. In step S44, the host computer 2 further updates the location information of each replaced wafer. When the target wafer has been connected to the probes 51 ("connected" in step S43), the host computer 2 skips the execution of the processing in step S44.

Next, the host computer 2 reads the identification information and the check code from the second memory area of the target wafer by using the controller 61, and confirms whether or not the read identification information is correct (step S45). In step S45, the host computer 2 executes the verification processing of determining whether or not the correspondence between the identification information and the check code which are read from the second memory area is correct. If it is confirmed that the correspondence between the identification information and the check code is correct, it is determined that the read identification information is correct, that is, the target wafer is the wafer with the identification information. On the other hand, if it is confirmed that the correspondence between the identification information and the check code is incorrect, it is determined that the read identification information is incorrect, that is, the target wafer is the wafer without the identification information. In general, when the target wafer is a new semiconductor wafer immediately after production, both values read from the second memory area as the identification information and the check code are random values. In this case, since the read identification information and the read check code are irrelevant to each other, it can be determined that the read identification information is incorrect, that is, the target wafer is the wafer without the identification information.

When the identification information is determined to be correct ("correct=with identification information" in step S45), since there is an irregular state in which a wafer without wafer control information stores identification information, the host computer 2 determines the wafer as an error (step S46), and ends the processing (end).

On the other hand, when it is determined that the identification information is incorrect ("incorrect=without identification information" in step S45), the host computer 2 issues the identification information for identifying the target wafer, and transmits a predetermined request requesting the writing of the identification information to the controller 61, thereby writing the issued identification information and the check code corresponding to the issued identification information to the second memory area of the target wafer (step S47). In step S47, the controller 61 writes the identification information and the check code corresponding to the identification information to the second memory area of the target wafer in response to receiving the predetermined request from the host computer 2.

The host computer 2 writes the data (user data) to the first memory area of the target wafer by transmitting the write request to the controller 61 (step S48). In step S48, the controller 61 writes the data (user data) from the host computer 2 to the physical storage location in the first memory area of the target wafer in response to receiving the write request from the host computer 2.

The host computer 2 adds the created control information to the wafer control information 400 (step S49) such that the created control information is associated with the identification information of the target wafer, and ends the processing (end). In step S49, the controller 61 acquires the wafer control information (L2P table and the like) corresponding to the target wafer from the host computer 2 or the first memory area of the target wafer, and updates the L2P table corresponding to the target wafer such that the physical address indicating the physical storage location in the first memory area to which the user data is written is associated with the logical address designated by the write request. Further, the controller 61 performs a process of writing the contents of the updated L2P table back to the main memory of the host computer 2 or to the first memory area of the target wafer at a predetermined timing.

Figure 16:
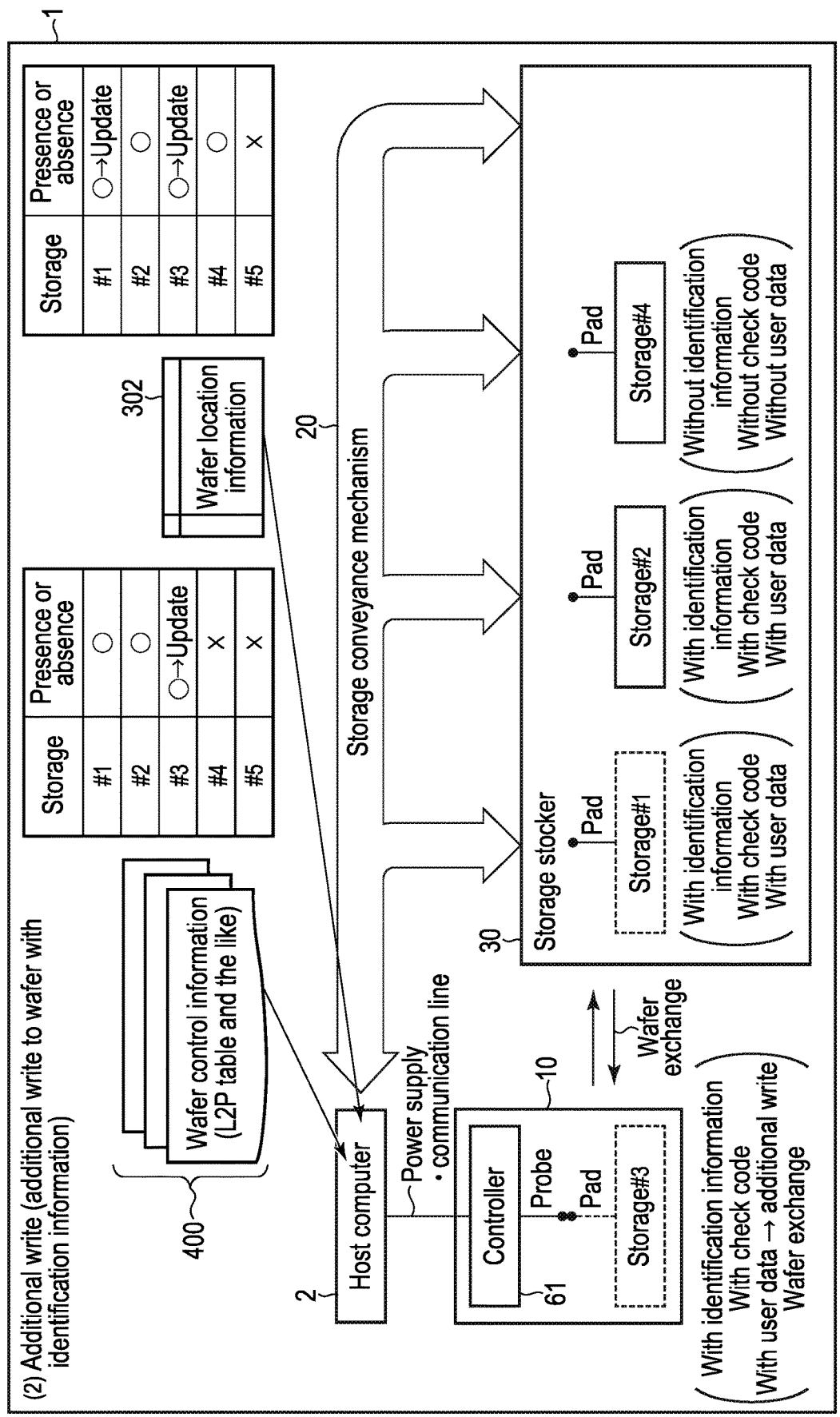
FIG. 16 is a diagram for explaining the additional write processing executed in the storage system.

FIG. 16 is a diagram for explaining the "additional write processing" executed in the storage system 1.

FIG. 16 illustrates the case where the additional write processing is performed on the storage #3 with the identification information stored in the storage stocker 30.

When the storage #1 (storage with the identification information) exists on the stage 12, the storage #1 returns from the stage 12 in the reader & writer (prober) 10 to the first wafer storage location in the storage stocker 30 where the storage #1 originally exists or other vacant wafer storage location in the storage stocker 30, and instead, the storage #3 is conveyed from the storage stocker 30 to the stage 12 as the semiconductor wafer to be accessed where the "additional write processing" should be executed.

In the wafer location information 302, the physical location of the storage #1 and the physical location of the storage #3 are updated. The physical location of the storage #1 indicated by the wafer location information 302 is updated from the location on the stage 12 to the first wafer storage location in the storage stocker 30. The physical location of the storage #3 indicated by the wafer location information 302 is updated from the third wafer storage location in the storage stocker 30 to the location on the stage 12.

The controller 61 reads the identification information and the check code from the second memory area of the storage #3 under the control of the host computer 2. Then, the verification processing of determining whether the correspondence between the read identification information and the read check code is correct is executed. The verification processing may be executed by either host computer 2 or controller 61, but the case where host computer 2 executes the verification processing is illustrated below.

The host computer 2 executes the verification processing, and determines whether the correspondence between the read identification information and the read check code is correct.

When the correspondence between the read identification information and the read check code is correct, it is determined that the read identification information is correct.

When the correspondence between the read identification information and the read check code is incorrect, it is determined that the read identification information is incorrect.

When the correspondence between the read identification information and the read check code is correct, the host computer 2 determines whether the read identification information matches the identification information (wafer ID #13) of the storage #3 managed by the host computer 2 to confirm that the semiconductor wafer conveyed to the stage 12 is the semiconductor wafer (here, storage #3) to be written. When the read identification information matches the identification information (wafer ID #13) of the storage #3 managed by the host computer 2, it is confirmed that the semiconductor wafer conveyed to the stage 12 is the storage #3. In this case, the host computer 2 is allowed to perform the "additional write processing" on the storage #3, that is, write data to the first memory area of the storage #3 with the identification information.

The host computer 2 loads the wafer control information corresponding to the storage #3 (L2P table and the like corresponding to the storage #3) into the controller 61, or the controller 61 acquires the wafer control information (L2P table and the like corresponding to the storage #3) corresponding to the storage #3 from the host computer 2 or the first memory area of the storage #3, so the wafer control information (L2P table and the like corresponding to the storage #3) corresponding to the storage #3 is stored in the SRAM 116 (or DRAM) of the controller 61.

Next, the controller 61 writes the data from the host computer 2 to the first memory area of the storage #3 in response to receiving the write request from the host computer 2. Then, the controller 61 updates the L2P table corresponding to the storage #3.

Figure 17:
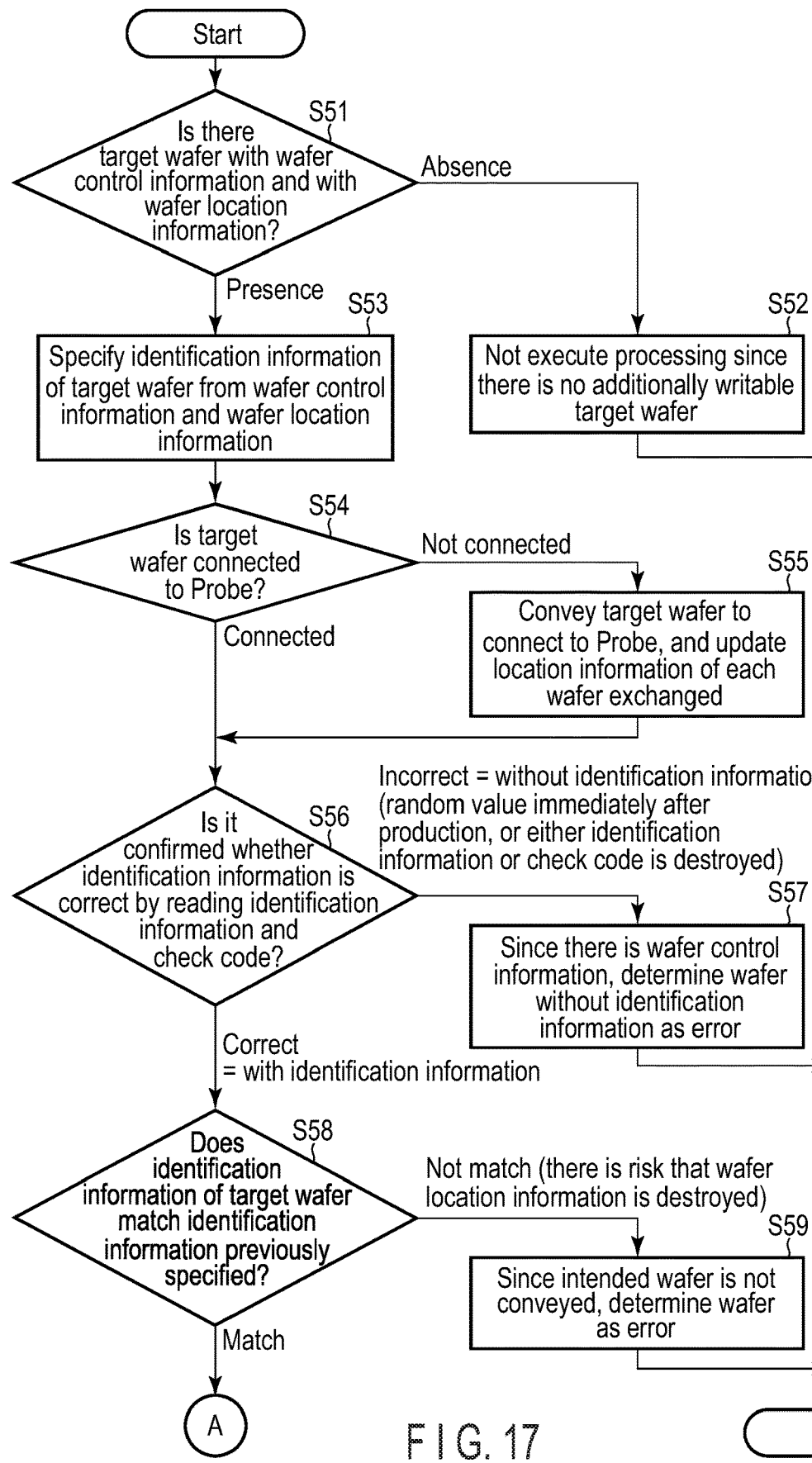
FIG. 17 is a flowchart illustrating a procedure of a part of the additional write processing controlled by the host computer.

FIG. 17 is a flowchart illustrating a procedure of a portion of the additional write processing controlled by the host computer 2.

The host computer 2 determines whether or not there is the target wafer with the wafer control information and with the wafer location information (step S51). Here, the target wafer with the wafer control information and with the wafer location information means the semiconductor wafer in which the corresponding wafer control information 400 exists and the physical location is managed.

When the target wafer with the wafer control information and with the wafer location information does not exist ("does not exist" in step S51), the host computer 2 determines that the target wafer cannot be processed since there is no target wafer on which additional write processing can be executed (step S52), and ends the processing (end).

When the target wafer with the wafer control information and with the wafer location information exists ("exists" in step S51), the host computer 2 specifies the target wafer identification information from the wafer control information 400 and the wafer location information 302 (step S53). In step S53, the wafer satisfying the condition that the corresponding wafer control information 400 exists and the physical location is managed may be searched for as the target wafer based on the wafer control information 400 and the wafer location information 302, and the identification information corresponding to the searched wafer may be acquired from the wafer identification information management table 301.

Next, the host computer 2 determines whether the target wafer is connected to the probes 51 based on the physical location of the target wafer indicated by the wafer location information 302 (step S54).

When the physical location of the target wafer indicates the location on the stage 12, it is determined that the target wafer is connected to the probes 51. On the other hand, when the physical location of the target wafer indicates a certain wafer storage location in the storage stocker 30, it is determined that the target wafer is not connected to the probes 51.

When the target wafer is not connected to the probes 51 ("not connected" in step S54), the host computer 2 controls the storage conveyance mechanism 20 of the storage device 3 to replace the storage existing on the stage 12 with the target wafer in the storage stocker 30, thereby connecting the target wafer to the probes 51 (step S55). In step S55, the host computer 2 may transmit the conveyance request to the storage device 3 that designates the wafer storage location in the storage stocker 30 where the target wafer is stored. In step S55, the host computer 2 further updates the location information of each replaced wafer. When the target wafer has been connected to the probe 51 ("connected" in step S54), the host computer 2 skips the execution of the processing in step S55.

Next, the host computer 2 reads the identification information and the check code from the second memory area of the target wafer by using the controller 61, and confirms whether or not the read identification information is correct (step S56). In step S56, the host computer 2 executes the verification processing of determining whether or not the correspondence between the identification information and the check code which are read from the second memory area is correct. If it is confirmed that the correspondence between the identification information and the check code is correct, it is determined that the read identification information is correct, that is, the target wafer is the wafer with the identification information. On the other hand, if it is confirmed that the correspondence between the identification information and the check code is incorrect, it is determined that the read identification information is incorrect, that is, the target wafer is the wafer without the identification information.

When the identification information is determined to be incorrect ("incorrect=without identification information" in step S56), since there is an irregular state where a wafer with wafer control information does not store identification information, the host computer 2 determines the wafer as an error (step S57), and ends the processing (end). For example, when the new semiconductor wafer immediately after production is erroneously conveyed to the stage 12, both the values read as the identification information and the check code from the second memory area of the semiconductor wafer are random values. In this case, since the read identification information and the read check code are irrelevant to each other, it can be determined that the read identification information is incorrect, that is, the target wafer is the wafer without the identification information. Therefore, by determining whether the correspondence between the identification information and the check code is correct, it is possible to prevent a situation in which the random value stored in the second memory area of the new semiconductor wafer immediately after the shipment from the factory is erroneously handled as the identification information, and thus a new semiconductor wafer (wafer without the identification information) immediately after the shipment from the factory is erroneously accessed.

On the other hand, when it is determined that the identification information is correct ("correct=with identification information" in step S56), the host computer 2 determines whether the read identification information matches the identification information previously specified in step S53 (step S58).

When the read identification information does not match the identification information previously specified in step S53 ("mismatch" in step S58), since a different wafer (another wafer with identification information) from the intended wafer is conveyed to the stage 12, the host computer 2 determines the wafer as error (step S59), and ends the processing (end). In this case, it is considered that the wafer location information is likely to be corrupted.

Figure 18:
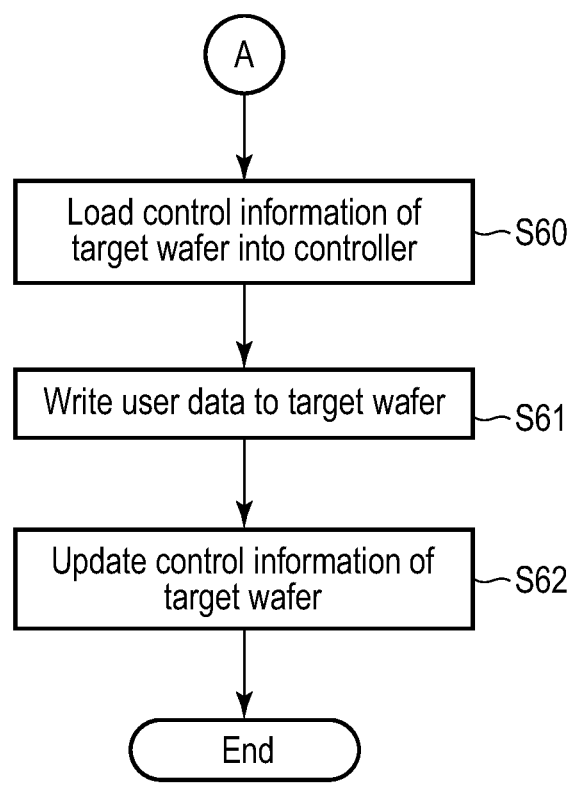
FIG. 18 is a flowchart illustrating the procedure of a continuation part of the additional write processing.

When the read identification information matches the identification information previously specified in step S53 ("match" in step S58), the processing proceeds to step S60 in FIG. 18.

In step S60, the host computer 2 loads the wafer control information (L2P table and the like which is associated with the identification information of the target wafer) associated with the identification information of the target wafer into the controller 61. In step S60, the controller 61 may acquire the wafer control information (L2P table and the like which is associated with the identification information of the target wafer) associated with the identification information of the target wafer from the host computer 2 or the first memory area of the target wafer.

The host computer 2 writes the data (user data) to the first memory area of the target wafer by transmitting the write request to the controller 61 (step S61). In step S61, the controller 61 writes the data (user data) from the host computer 2 to the physical storage location in the first memory area of the target wafer in response to receiving the write request from the host computer 2.

Then, the controller 61 updates the L2P table corresponding to the target wafer such that the physical address indicating the physical storage location in the first memory area where the user data is written is associated with the logical address designated by the write request (step S62), and ends the processing (end). Further, the controller 61 performs a process of writing the contents of the updated L2P table back to the main memory of the host computer 2 or to the first memory area of the target wafer at a predetermined timing.

Figure 19:
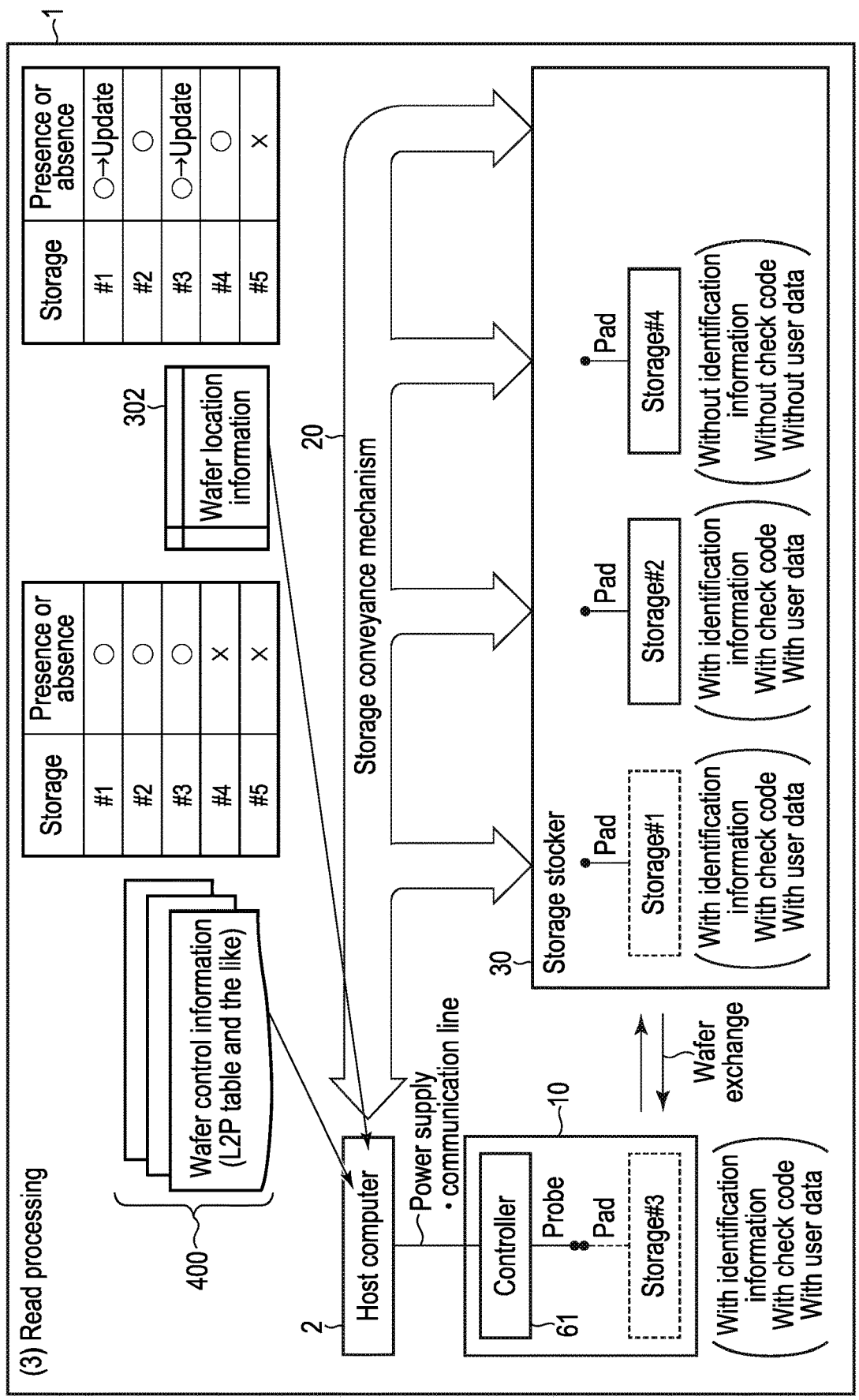
FIG. 19 is a diagram for explaining the read processing executed in the storage system.

FIG. 19 is a diagram for explaining the "read processing" executed in the storage system 1.

FIG. 19 illustrates the case where the read processing is performed on the storage #3 with the identification information stored in the storage stocker 30.

When the storage #1 (storage with the identification information) exists on the stage 12, the storage #1 returns from the stage 12 in the reader & writer (prober) 10 to the first wafer storage location in the storage stocker 30 where the storage #1 originally exists, and instead, the storage #3 is conveyed from the storage stocker 30 to the stage 12 as the semiconductor wafer to be accessed where the "read processing" should be executed.

In the wafer location information 302, the physical location of the storage #1 and the physical location of the storage #3 are updated. The physical location of the storage #1 indicated by the wafer location information 302 is updated from the location on the stage 12 to the first wafer storage location in the storage stocker 30. The physical location of the storage #3 indicated by the wafer location information 302 is updated from the third wafer storage location in the storage stocker 30 to the location on the stage 12.

The controller 61 reads the identification information and the check code from the second memory area of the storage #3 under the control of the host computer 2. Then, the verification processing of determining whether the correspondence between the read identification information and the read check code is correct is executed. The verification processing may be executed by either host computer 2 or controller 61, but the case where host computer 2 executes the verification processing is illustrated below.

The host computer 2 executes the verification processing, and determines whether the correspondence between the read identification information and the read check code is correct.

When the correspondence between the read identification information and the read check code is correct, it is determined that the read identification information is correct.

When the correspondence between the read identification information and the read check code is incorrect, it is determined that the read identification information is incorrect.

When the correspondence between the read identification information and the read check code is correct, the host computer 2 determines whether the read identification information matches the identification information (wafer ID #13) of the storage #3 managed by the host computer 2 to confirm that the semiconductor wafer conveyed to the stage 12 is the semiconductor wafer (here, storage #3) to be read. When the read identification information matches the identification information (wafer ID #13) of the storage #3 managed by the host computer 2, it is confirmed that the semiconductor wafer conveyed to the stage 12 is the storage #3. In this case, the host computer 2 is allowed to perform the "read processing" on the storage #3, that is, to read data from the first memory area of the storage #3 with the identification information.

The host computer 2 loads the wafer control information corresponding to the storage #3 (L2P table and the like corresponding to the storage #3) into the controller 61, or the controller 61 acquires the wafer control information (L2P table and the like corresponding to the storage #3) corresponding to the storage #3 from the host computer 2 or the first memory area of the storage #3, so the wafer control information (L2P table and the like corresponding to the storage #3) corresponding to the storage #3 is stored in the SRAM 116 (or DRAM) of the controller 61.

Then, in response to receiving the read request from the host computer 2, the controller 61 acquires the physical address corresponding to the logical address designated by the read request by referring to the L2P table corresponding to the storage #3. The controller 61 reads data from the first memory area of the storage #3 based on the acquired physical address. Then, the controller 61 transmits the read data to the host computer 2.

Figure 20:
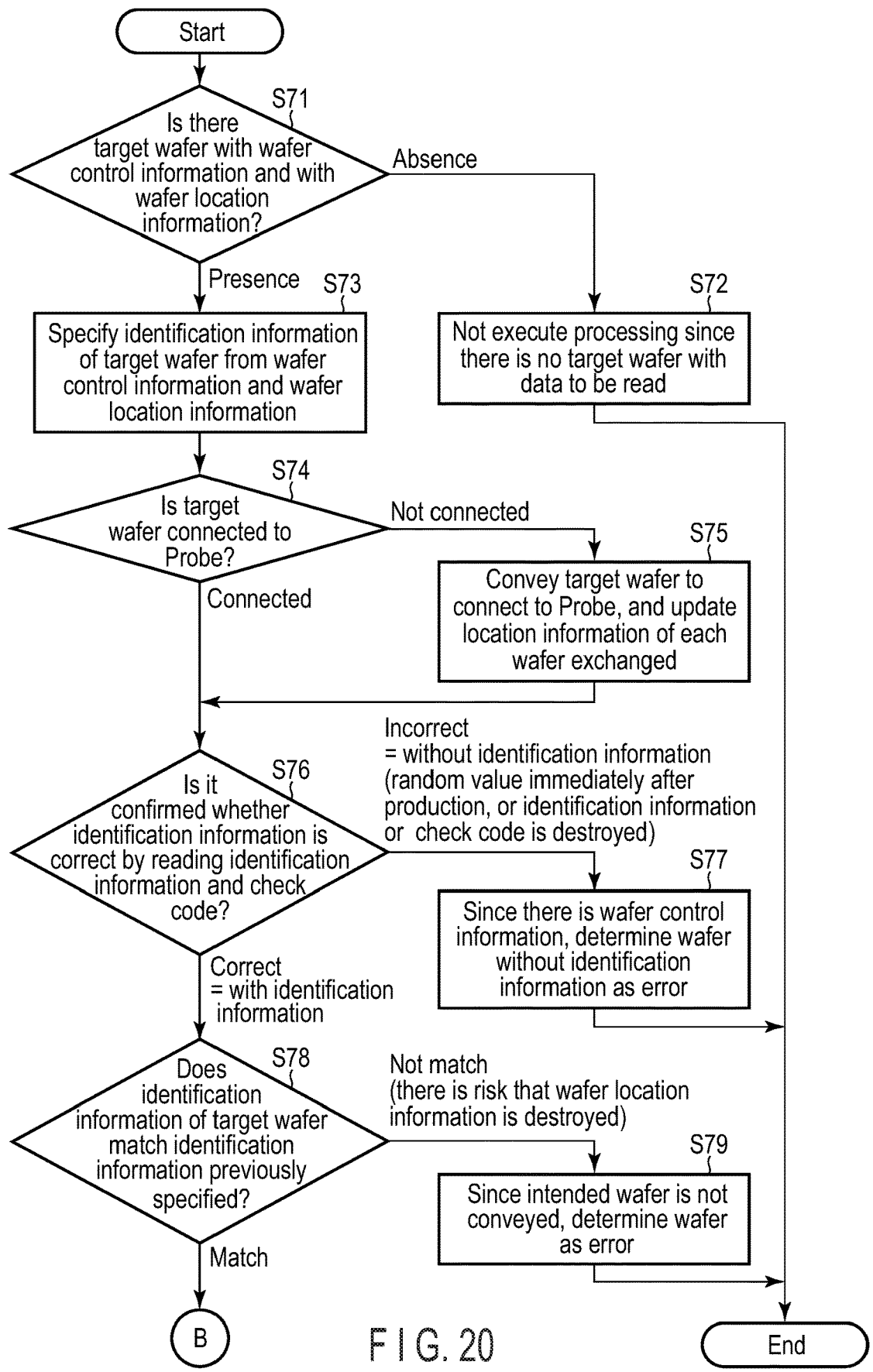
FIG. 20 is a flowchart illustrating a procedure of a part of the read processing.

FIG. 20 is a flowchart illustrating a procedure of a portion of the read processing.

The host computer 2 determines whether or not there is the target wafer with the wafer control information and with the wafer location information (step S71). Here, the target wafer with the wafer control information and with the wafer location information means the semiconductor wafer in which the corresponding wafer control information 400 exists and the physical location is managed.

When the target wafer with the wafer control information and with the wafer location information does not exist ("does not exist" in step S71), the host computer 2 determines that the target wafer cannot be processed since there is no target wafer in which data to be read is stored (step S72), and ends the processing (end).

When the target wafer with the wafer control information and with the wafer location information exists ("exists" in step S71), the host computer 2 specifies the target wafer identification information from the wafer control information 400 and the wafer location information 302 (step S73). In step S73, the host computer 2 searches for, as the target wafer, the wafer satisfying the condition that the corresponding wafer control information 400 exists and the physical location is managed based on the wafer control information 400 and the wafer location information 302, and may acquire the identification information corresponding to the searched wafer from the wafer identification information management table 301.

Next, the host computer 2 determines whether the target wafer is connected to the probes 51 based on the physical location of the target wafer indicated by the wafer location information 302 (step S74).

When the physical location of the target wafer indicates the location on the stage 12, it is determined that the target wafer is connected to the probes 51. On the other hand, when the physical location of the target wafer indicates a certain wafer storage location in the storage stocker 30, it is determined that the target wafer is not connected to the probes 51.

When the target wafer is not connected to the probes 51 ("not connected" in step S74), the host computer 2 controls the storage conveyance mechanism 20 of the storage device 3 to replace the storage existing on the stage 12 with the target wafer in the storage stocker 30, thereby connecting the target wafer to the probes 51 (step S75). In step S75, the host computer 2 may transmit a conveyance request to the storage device 3 that designates the wafer storage location in the storage stocker 30 where the target wafer is stored. In step S75, the host computer 2 further updates the location information of each replaced wafer. When the target wafer has been connected to the probes 51 ("connected" in step S74), the host computer 2 skips the execution of the processing in step S75.

Next, the host computer 2 reads the identification information and the check code from the second memory area of the target wafer by using the controller 61, and confirms whether or not the read identification information is correct (step S76). In step S76, the host computer 2 executes the verification processing of determining whether or not the correspondence between the identification information and the check code which are read from the second memory area is correct. If it is confirmed that the correspondence between the identification information and the check code is correct, it is determined that the read identification information is correct, that is, the target wafer is the wafer with the identification information. On the other hand, if it is confirmed that the correspondence between the identification information and the check code is incorrect, it is determined that the read identification information is incorrect, that is, the target wafer is the wafer without the identification information.

When the identification information is determined to be incorrect ("incorrect=without identification information" in step S76), since there is an irregular state where a wafer with wafer control information does not store identification information, the host computer 2 determines the wafer as an error (step S77), and ends the processing (end). For example, when the new semiconductor wafer immediately after production is erroneously conveyed to the stage 12, both the values read as the identification information and the check code from the second memory area of the semiconductor wafer are random values. In this case, since the read identification information and the read check code are irrelevant to each other, it can be determined that the read identification information is incorrect, that is, the target wafer is the wafer without the identification information. Therefore, by determining whether the correspondence between the identification information and the check code is correct, the new semiconductor wafer (wafer without identification information) immediately after the shipment from the factory can be prevented from being erroneously accessed as the semiconductor wafer with the identification information that has already been used to write data.

On the other hand, when it is determined that the identification information is correct ("correct=with identification information" in step S76), the host computer 2 determines whether the read identification information matches the identification information previously specified in step S73 (step S78).

When the read identification information does not match the identification information previously specified in step S73 ("mismatch" in step S78), since a different wafer (another wafer with identification information) from the intended wafer is conveyed to the stage 12, the host computer 2 determines the wafer as an error (step S79) and ends the processing (end). In this case, it is considered that the wafer location information is likely to be corrupted.

Figure 21:
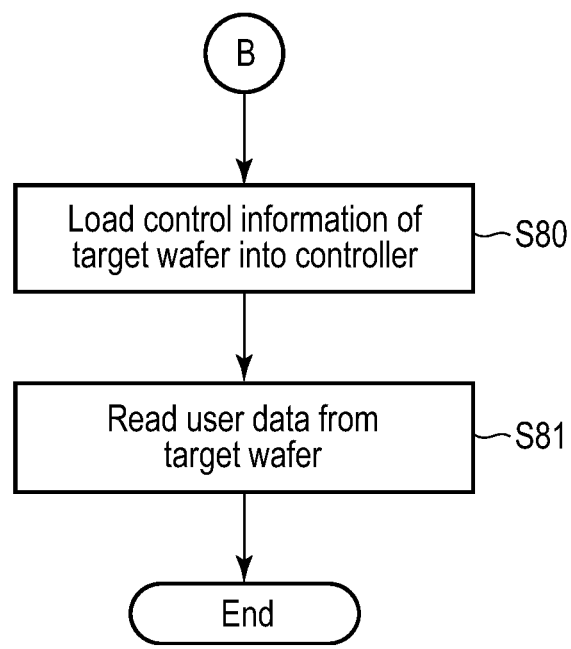
FIG. 21 is a flowchart illustrating the procedure of the continuation part of the read processing.

When the read identification information matches the identification information previously specified in step S73 ("match" in step S78), the process proceeds to step S80 in FIG. 21.

In step S80, the host computer 2 loads the wafer control information (L2P table and the like which is associated with the identification information of the target wafer) associated with the identification information of the target wafer into the controller 61. In step S80, the controller 61 may acquire the wafer control information (L2P table and the like which is associated with the identification information of the target wafer) associated with the identification information of the target wafer from the host computer 2 or the first memory area of the target wafer.

The host computer 2 read the data (user data) from the first memory area of the target wafer by transmitting the write request to the controller 61 (step S81), and ends the processing (end).

In step S81, the controller 61 acquires, from the L2P table, the physical address corresponding to the logical address designated by the read request received from host computer 2 by referring to the L2P table associated with the identification information of the target wafer. The controller 61 reads data from the first memory area of the target wafer based on the acquired physical address. Then, the controller 61 transmits the read data to the host computer 2.

FIG. 22 is a diagram for explaining the "wafer addition processing" executed in the storage system 1.

FIG. 22 illustrates the case where the storage #5 is physically added to, for example, a fifth wafer storage location in the storage stocker 30 by the user in the state in which the physical locations of the storage #1 to storage #4 are managed by the wafer location information 302. The storage #5 is, for example, a new semiconductor wafer (wafer without the identification information) immediately after the shipment from the factory.

In this case, the host computer 2 adds the location information indicating the physical location of the storage #5 to the wafer location information 302. A sensor provided at each storage location in the storage stocker 30 may automatically detect that the new storage (semiconductor wafer) is physically added to the storage stocker 30 and the wafer storage location in the storage stocker 30 to which the new storage (semiconductor wafer) is physically added. Alternatively, the user inputs to the host computer 2 information indicating that the new storage is physically added to the storage stocker 30 and the information indicating the storage location where the new storage is physically added, by operating the storage management tool 216, and the host computer 2 may detect that the new storage is physically added to the storage stocker 30 by using the input of these information as a trigger.

Figure 23:
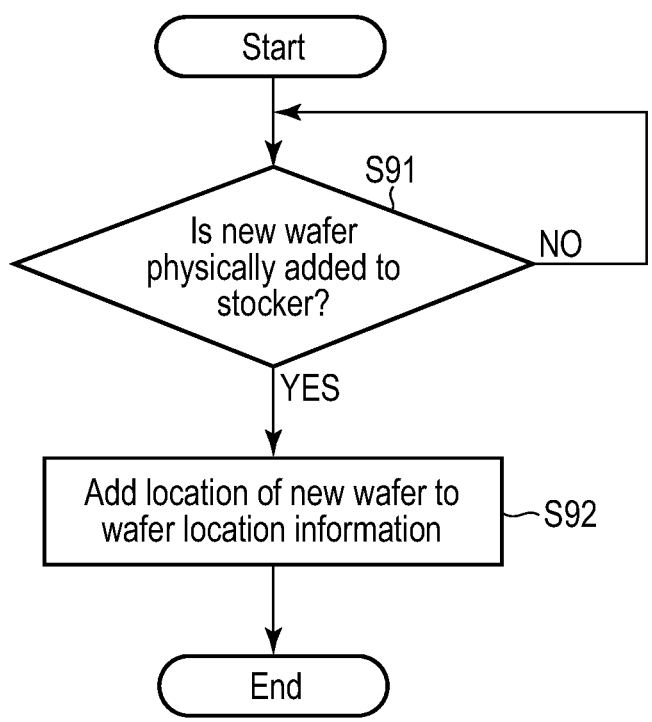
FIG. 23 is a flowchart illustrating a procedure of the wafer addition processing.

FIG. 23 is a flowchart illustrating a procedure of the wafer addition processing.

When the host computer 2 detects that the new storage (semiconductor wafer) is physically added to the wafer storage location in the storage stocker 30 (YES in step S91), the host computer 2 adds the location information indicating the physical location of the new storage to the wafer location information 302 (step S92), and end the processing (end).

The wafer control information corresponding to the added new storage may be created when executing the new write processing on the added new storage. In addition, the identification information corresponding to the added new storage may be issued when performing the new write processing on the added new storage.

Figure 24:
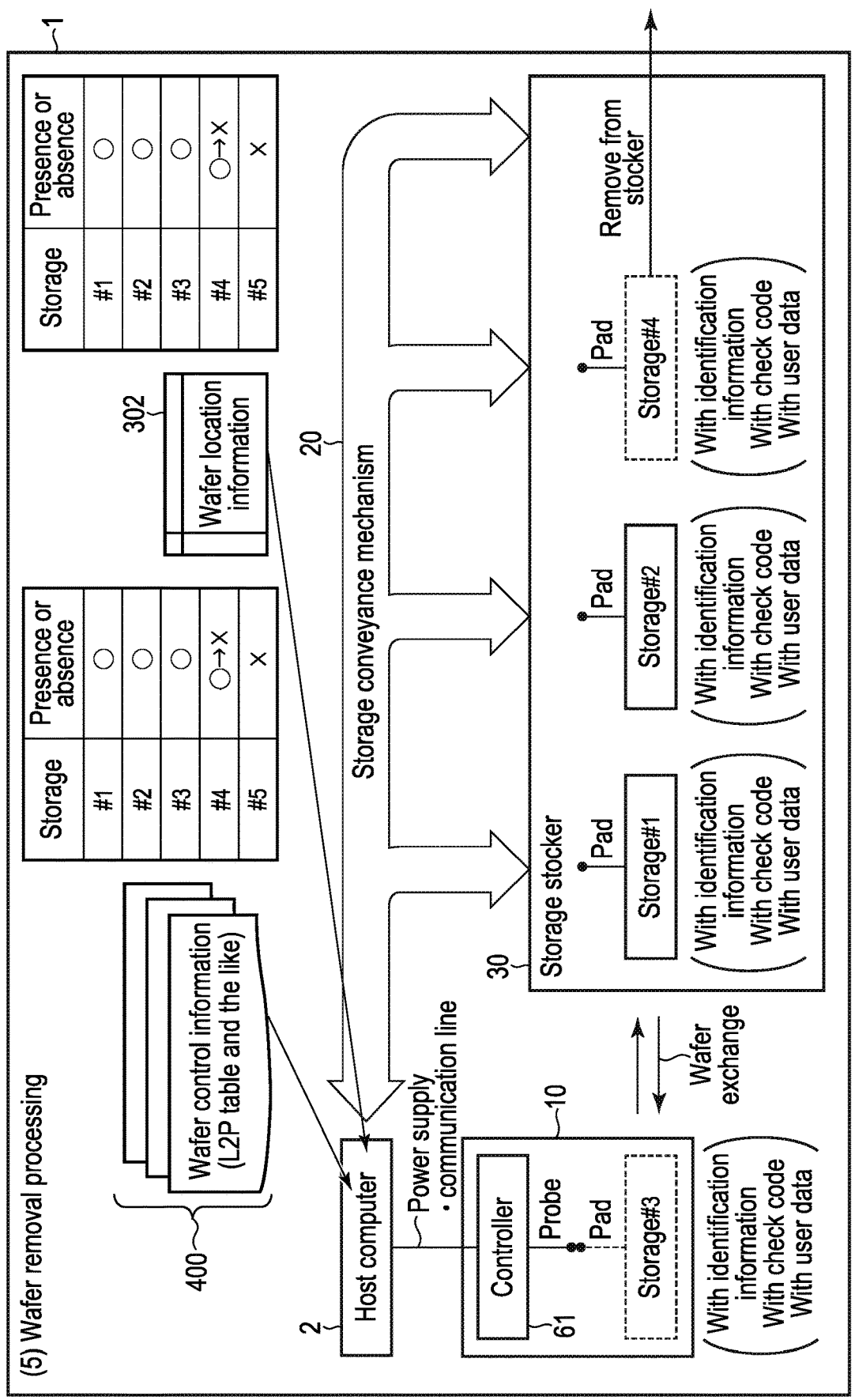
FIG. 24 is a diagram for explaining the wafer removal processing executed in the storage system.

FIG. 24 is a diagram for explaining the "wafer removal processing" executed in the storage system 1.

FIG. 24 illustrates the case where the storage #4 is removed from the storage stocker 30 by the user in the state in which the physical locations of the storage #1 to the storage #4 are managed by the wafer location information 302. The storage #4 is the semiconductor wafer with the identification information.

In this case, the host computer 2 deletes the location information indicating the physical location of the storage #4 from the wafer location information 302. In addition, the host computer 2 may also delete the wafer control information associated with the identification information of the storage #4.

The sensor provided at each storage location in the storage stocker 30 may automatically detect that the storage is removed from the storage stocker 30 and the wafer storage location in the storage stocker 30 from which the storage is removed. Alternatively, the user inputs to the host computer 2 information indicating that the storage is removed and the information indicating the storage location where the storage is removed, by operating the storage management tool 216, and the host computer 2 may detect that the storage is removed from the storage stocker 30.

Figure 25:
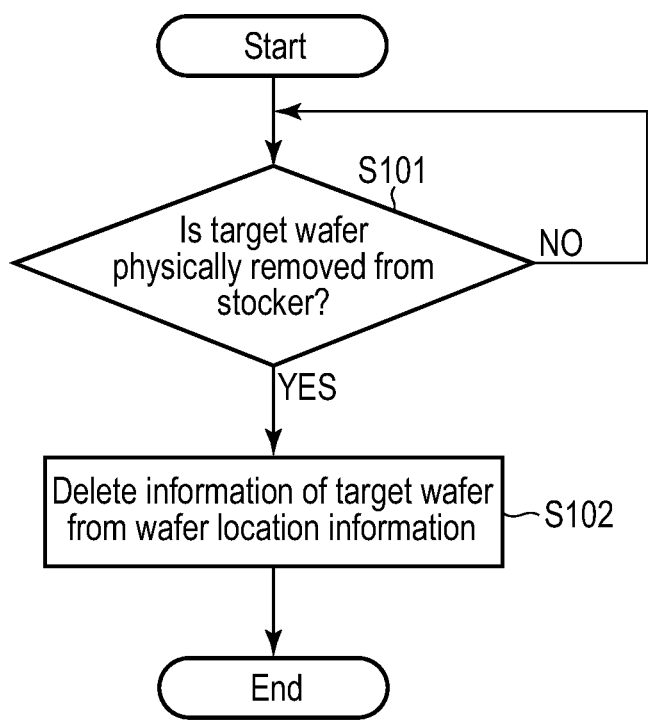
FIG. 25 is a flowchart illustrating a procedure of the wafer removal processing.

FIG. 25 is a flowchart illustrating a procedure of the wafer removal processing.

When the host computer 2 detects that the storage (semiconductor wafer) is physically removed from the storage stocker 30 (YES in step S101), the host computer 2 deletes the location information indicating the physical location of the physically removed storage from the wafer location information 302 (step S102), and ends the processing (end).

When there is the wafer control information corresponding to the physically removed storage, the host computer 2 may also delete the wafer control information corresponding to the physically removed storage.

As described above, according to the present embodiment, the controller 61 writes the identification information and the check code for checking the integrity of the identification information to the second memory area of the semiconductor wafer 40. This makes it possible to correctly distinguish between the semiconductor wafer to which data has already been written and the new semiconductor wafer immediately after the shipment from the factory.

When the set of identification information and check code having the correct correspondence is stored in the second memory area of the target wafer conveyed to the stage 12, the controller 61 acquires the L2P table associated with the identification information of the target wafer from the host computer 2 or the first memory area of the target wafer. Therefore, since the controller 61 can refer to or update the correct L2P table corresponding to the identification information of the target wafer, the controller 61 can correctly manage the correspondence between each of the logical addresses used to access the target wafer and each of the physical addresses of the target wafer and can correctly read the read target data designated by the host computer 2 from the target wafer.

On the other hand, when the set of identification information and check code having the correct correspondence is not stored in the second memory area of the target wafer conveyed to the stage 12, the controller 61 writes the identification information for identifying the target wafer and the check code for checking the integrity of the identification information to the second memory area of the target wafer based on the request from the host computer 2. This makes it possible to write and read data to and from the target wafer. Therefore, for example, the user can easily increase the storage capacity that can be handled by the storage system 1 simply by adding the new semiconductor wafer immediately after the shipment from the factory to the storage stocker 30.

In addition, the host computer 2 manages a plurality of pieces of identification information corresponding to the plurality of semiconductor wafers to each of which the identification information and the check code are written. Furthermore, when the set of identification information and check code having the correct correspondence is stored in the second memory area of the semiconductor wafer conveyed from the storage stocker 30 to the stage 12 by the storage conveyance mechanism 20 and the identification information stored in the second memory area of the semiconductor wafer conveyed to the stage 12 matches the identification information of the semiconductor wafer to be accessed which is designated by the host computer 2, the host computer 2 is allowed to write data to the first memory area of the semiconductor wafer conveyed to the stage 12 and to read data from the first memory area of the semiconductor wafer conveyed to the stage 12. Therefore, even when the unintended semiconductor wafer different from the access target semiconductor wafer designated by host computer 2 is conveyed from the storage stocker 30 to the stage 12, it is possible to prevent data from being written or read to or from the unintended semiconductor wafer, and improve the reliability of the storage system 1 that uses the semiconductor wafer as the storage.

In addition, the host computer 2 manages the wafer storage location where each semiconductor wafer 40 is stored. The host computer 2 transmits, to the storage device 3, the conveyance request designating the wafer storage location where the semiconductor wafer 40 to be accessed is stored, and as a result, can instruct the storage device 3 (storage conveyance mechanism 20) that the semiconductor wafer 40 to be accessed should be conveyed from the designated wafer storage location in the storage stocker 30 to the stage 12 in the reader & writer (prober) 10. Therefore, the host computer 2 can convey the desired semiconductor wafer 40 among the plurality of semiconductor wafers 40 in the storage stocker 30 to the stage 12.

While certain embodiments have been described, these embodiments have been presented by way of example only, and are not intended to limit the scope of the inventions. Indeed, the novel embodiments described herein may be embodied in a variety of other forms;

furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
   a storage mediwn including a plurality of memory dies:
   a plurality of terminals for reading or writing data from and to each of the memory dies: and
   a controller connected the terminals,
   the storage medium comprising:
   electrodes configured to be connected to the terminals:
   a first memory area to store user data; and
   a second memory area to store identification information for identification of the storage medium and a check code for checking integrity of the identification information, the check code being calculated from the identification information, wherein the integrity of the identification information is checked by determining whether or not a set of identification information and a check code having a correct correspondence is, stored in in the second memory area, and
   the controller being configured to read the identification information and the check code from the second memory area.

2. The storage device according to claim 1, wherein
   the controller writes first identification information for identifying the storage medium and a first check code for checking integrity of the first identification information to the second memory area when a set of identification information and a check code having a correct correspondence is not stored in the second memory area.

3. The storage device according to claim 1, wherein the controller acquires a first logical-to-physical address translation table associated with the identification information stored in the second metnory area from outside or the first memory area when the set of the identification information and the check code having the correct correspondence is stored in the second memory area.

4. The storage device according to claim 1, wherein the electrodes, the first memory area and the second memory area are included in the memory dies.

5. The storage device according to claim 2, wherein the electrodes, the first memory area, and the second memory area are included in the memory dies.

6. The storage device according to claim 3, wherein the electrodes, the first memory area and the second memory area are included in the memory dies.

7. The storage device according to claim 1, further comprising:
a probe card, wherein
the terminals and the controller are included in the probe card.

8. The storage device according to claim 7, further comprising:
a stage on which the storage medium is mounted and a driver, wherein
the driver moves the probe card or the stage to bring the electrodes of the storage medium mounted on the stage into contact with the terminals.

9. The storage device according to claim 1, further comprising:
a stocker to store, a plurality of storag mediums each of which includes a plurality of memory dies.

10. The storage device according to claim 9, further comprising:
a stage on which the storage mediums can be mounted:
a conveyance apparatus which conveys a semiconductor wafer to the stage from the stocker, wherein
the conveyance apparatus replaces the storage mediwn mounted on the stage with any one of the plurality of storage mediums in the stocker.

11. The storage device according to claim 9, wherein the controller writes identification information different from each other to the plurality of storage mediums, respectively.

12. The storage device according to claim 10, wherein the controller writes identification information different from each other to the plurality of storage mediums, respectively.

13. The storage device according to claim 11, wherein the controller checks, by the check code, each storage medium as to whether the identification information written is correct, and writes to or reads from the memory die of the storage medium only when the identification information written is correct.

14. The storage device according to claim 1. wherein the controller is configured to:
when the set of the identification information and the check code having the correct correspondence is stored in the second memory area,
acquire a first logical-to-physical address translation table associated with the identification information from outside or the first memory area;

in response to receiving a write request, write data to a physical storage location in the first memory area, and update the first logical-to-physical address translation table such that a physical address indicating the physical storage location is associated with a logical address designated by the write request; and
in response to receiving a read request, acquire a physical address corresponding to a logical address designated by the read request 1w referring to the first logical-to-physical address translation table, and read data from the first memory area based on the acquired physical address.

15. The storage device according to claim 1, wherein when the set of the identification information and the check code having the correct correspondence is stored in the second memory area, the controller is configured to acquire first logical-to-physical address translation table associated with the identification information of the storage medium and first defect information associated with the identification information of the storage medium from outside or the first memory area, and
the first defect information indicates a defective block included in the plurality of memory dies in the storage medium.

16. The storage device according to claim 1, wherein the controller is configured to erase both contents of the first memory area and contents of the second memory area when erasing all data in the first memory area.

17. A storage system comprising a host computer and a storage device,
the storage device comprising:
a reader & writer in which a probe is mounted; and
a stocker to store a plurality of storage mediums each of which includes a plurality of memory dies,
the reader & writer being configured to write and read data to and from a first storage medium which is one storage medium among the plurality of storage mediums,
the reader & writer comprising:
a driver,
the probe card comprising:
a plurality of terminals: and
a controller connected to the terminals,
each of the plurality of storage mediums comprising:
electrodes configured to he connected to the terminals,
a first memory area to store user data; and
a second memory area to store identification information for identifying the storage medium and a check code for checking integrity of the identification information, the check code being calculated from the identification information, wherein the integrity of the identification information is checked by determining whether or not a set of identification information and a check code having a correct correspondence is stored in in the second memory area. the driver moving the probe card to bring electrodes of the first storage medium into contact with the terminals,
the controller being configured to:
execute write or read of data with respect to the first storage medium in response to a write request or read request from the host computer;
when a set of identification information and a check code having a correct correspondence is not stored in the second memory area of the first storage medium, write first identification information for identifying the first storage medium and a first check code for checking integrity of the first identification information to the second memory area in the first storage medium, based on a request from the host computer; and when the set of the identification information and the check code having the correct correspondence is stored in the second memory area of the first storage medium, acquire a first logical-to-physical address translation table associated with the identification information of the first storage medium from the host computer or the first memory area of the first storage medium.

18. The storage system according to claim 17, wherein when the set of the identification information and the check code having the correct correspondence is not stored in the second memory area of the first storage medium, the controller writes data to the first memory area of the first storage medium after the controller writes the first identification information and the first check code to the second memory area of the first storage medium.

19. The storage system according to claim 17, wherein the controller is configured to:

when the set of the identification information and the check code having the correct correspondence is stored in the second memory area of the first storage medium, acquire the first logical-to-physical address translation table from the host computer or the first memory area of the first storage medium;

in response to receiving a write request from the host computer, write data to a physical storage location in the first memory area of the first storage medium, and update the first logical-to-physical address translation table such that a physical address indicating the physical storage location is associated with a logical address designated by the write request; and in response to receiving a read request from the host computer, acquire a physical address corresponding to a logical address designated by the read request by referring to the first logical-to-physical address translation table, and read data from the first memory area of the first storage medium based on the acquired physical address.

20. The storage system according to claim 17, wherein the host computer is configured to manage a plurality of logical-to-physical address translation tables and a plurality of pieces of defect information, each of the plurality of logical-to-physical address translation tables and each of the plurality of pieces of defect information corresponding to each of the storage mediums to which identification information and a check code for checking integrity of the identification information are written, each of the plurality of pieces of defect information indicates a defective block included in a plurality of memory dies in a corresponding storage medium, when the set of the identification information and the check code having the correct correspondence is stored in the second memory area of the first storage medium, the controller is configured to acquire the first logical-to-physical address translation table associated with the identification information of the first storage medium and first defect information associated with the identification information of the first storage medium from the host computer or the first memory area of the first storage medium, and the first defect information indicates a defective block included in a plurality of memory dies in the first storage medium.

21. The storage system according to claim 17, wherein the host computer is configured to cause the controller to erase both contents of the first memory area of the first storage medium and contents of the second memory area of the first storage medium when erasing all data in the first memory area of the first storage medium.

22. The storage system according to claim 17, wherein the host computer is configured to manage a plurality of pieces of identification information corresponding to the plurality of storage mediums to each of which identification information and a check code for checking integrity of the identification information are written, and the host computer is allowed to write data to the first memory area of the first storage medium and read data from the first memory area of the first storage medium when the set of the identification information and the check code having the correct correspondence is stored in the second memory area of the first storage medium and the identification information stored in the second memory area matches identification information of a storage medium to be accessed which is designated by the host computer.

23. The storage system according to claim 17, wherein the host computer is configured to determine whether the set of the identification information and the check code having the correct correspondence is stored in the second memory area of the first storage medium by executing verification processing of determining whether correspondence between identification information and a check code which are read from the second memory area of the first storage medium is correct.

24. The storage system according to claim 17, wherein the reader & writer further comprises a stage on which one storage medium among the plurality of storage mediums is mounted, the host computer is configured to manage location information indicating physical locations where the plurality of storage mediums exist, and the physical locations each indicate whether the respective storage medium is stored on the stage or in the stocker, and when stored in the stocker, a location in the stocker where the respective storage medium is stored.

* * * * *